(12) United States Patent
Ohkami

(10) Patent No.: US 7,054,802 B2
(45) Date of Patent: May 30, 2006

(54) HARDWARE-ASSISTED DESIGN VERIFICATION SYSTEM USING A PACKET-BASED PROTOCOL LOGIC SYNTHESIZED FOR EFFICIENT DATA LOADING AND UNLOADING

(75) Inventor: Takahide Ohkami, Newton, MA (US)

(73) Assignee: Quickturn Design Systems, Inc., San Jose, CA (US)

( * ) Notice: Subject to any disclaimer, the term of this patent is extended or adjusted under 35 U.S.C. 154(b) by 758 days.

(21) Appl. No.: 09/879,658

(22) Filed: Jun. 11, 2001

(65) Prior Publication Data

US 2002/0049578 A1  Apr. 25, 2002

Related U.S. Application Data

(60) Provisional application No. 60/242,407, filed on Oct. 20, 2000.

(51) Int. Cl.
*G06F 17/50* (2006.01)
*G06F 11/00* (2006.01)

(52) U.S. Cl. ............... 703/15; 703/14; 714/28; 714/33; 716/4

(58) Field of Classification Search .............. 703/14, 703/15; 714/28, 33; 716/4
See application file for complete search history.

(56) References Cited

U.S. PATENT DOCUMENTS

| | | | | |
|---|---|---|---|---|
| 5,475,681 | A * | 12/1995 | White et al. | 370/349 |
| 5,477,541 | A * | 12/1995 | White et al. | 370/392 |
| 5,524,007 | A * | 6/1996 | White et al. | 370/419 |
| 5,546,562 | A | 8/1996 | Patel | |
| 5,841,967 | A * | 11/1998 | Sample et al. | 714/33 |
| 6,618,839 | B1 * | 9/2003 | Beardslee et al. | 716/4 |
| 6,931,572 | B1 * | 8/2005 | Schubert et al. | 714/34 |

FOREIGN PATENT DOCUMENTS

| | | |
|---|---|---|
| EP | 0 838 772 A2 | 4/1998 |
| WO | WO 9914891 * | 3/1999 |

OTHER PUBLICATIONS

"X.25". Internet Technology Overview, Jun. 1999. Chapter 17.*
Koch G.H. et al, "Breakpoints and Breakpoint Detection in Source-level Emulation," ACM Transactions on Design Automation of Electronic System, Apr. 1998, vol. 3, No. 2, pp. 209-230.
Koch, G.H. et al, "Debugging of Behavioral VHDL Specifications by Source Level Emulation" Proceedings Euro-DAC '95. European Design Automation Conference with Euro-BHDL, Proceedings of Euro-DAC. European Design Automation Conference, Brighton, UK Sep. 18-22, 1995.

(Continued)

*Primary Examiner*—Paul L. Rodriguez
*Assistant Examiner*—Ayal Sharon
(74) *Attorney, Agent, or Firm*—Orrick, Herrington & Sutcliffe LLP

(57) ABSTRACT

A system is provided to increase the accessibility of registers and memories in a user's design undergoing functional verification in a hardware-assisted design verification system. A packet-based protocol is used to perform data transfer operations between a host workstation and a hardware accelerator for loading data to and unloading data from the registers and memories in a target design under verification (DUV) during logic simulation. The method and apparatus synthesizes interface logic into the DUV to provide for greater access to the registers and memories in the target DUV which is simulated with the assistance of the hardware accelerator.

3 Claims, 19 Drawing Sheets

OTHER PUBLICATIONS

Potkonjak, M. et al, "Design-for-Debugging of Application Specific Designs" 1995 IEEE/ACM Internationa Conference on Computer-Aided Design (ICCAD), San Jose, California Nov. 5-9, 1995 and IEEE/ACM International Conference on Computer-Aided Design, Los Alamitos, California Nov. 5, 1995.

Communication issued Feb. 18, 2005, European Patent Office.

* cited by examiner

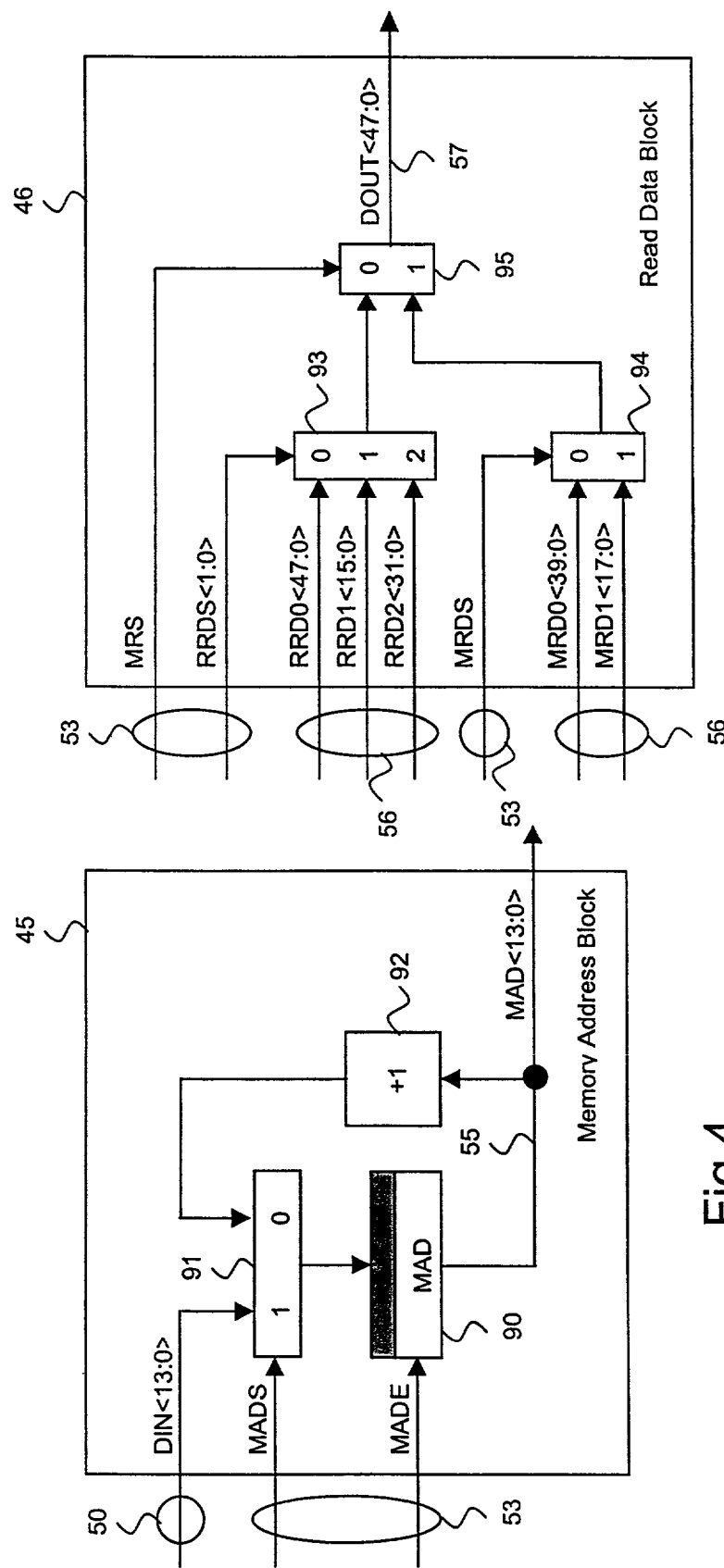

| DATA | TAG | CMD | END | ID | DATA |
|---|---|---|---|---|---|
| | 0 | 1 | 4 | 5 | 7 |
| NOP | Tag | 0/1 | - | - | - |
| WR | Tag | 2 | - | Rid | Write Data |
| RR | Tag | 3 | - | Rid | - |
| SWM | Tag | 4 | - | Mid | Start Address |
| WM | Tag | 5 | End | - | Write Data |
| SRM | Tag | 6 | - | Mid | Start Address |
| RM | Tag | 7 | End | - | - |

| CYCLE | N | N+1 | N+2 | N+3 | N+4 | N+5 |
|---|---|---|---|---|---|---|
| NEWIN | 1 | 1 | 0 | 1 | 1 | 0 |
| CMD | WR | WR | - | WR | WR | - |
| DIN | A | B | - | C | D | - |
| REG | - | A | B | - | C | D |

Fig.11B

| CYCLE | N | N+1 | N+2 | N+3 | N+4 | N+5 |
|---|---|---|---|---|---|---|
| NEWIN | 1 | - | - | 1 | - | - |
| CMD | RR | - | - | RR | - | - |
| REG | A | A | A | B | B | B |
| POUT(DATA) | - | - | A | A | B | B |
| TRANSFER | - | - | A | - | - | - |

| CYCLE | N | N+1 | N+2 | N+3 | N+4 | N+5 |
|---|---|---|---|---|---|---|
| NEWIN | 1 | 1 | 1 | 0 | 1 | 0 |
| CMD | SWM | WM | WM | - | WM | - |
| DIN | 10 | A | B | - | C | - |
| MAD | - | 10 | 11 | 12 | 12 | 13 |
| MEM | - | A | B | - | C | - |

Fig.11C

| CYCLE | N | N+1 | N+2 | N+3 | N+4 | N+5 | N+6 |
|---|---|---|---|---|---|---|---|
| NEWIN | 1 | 1 | 0 | 0 | 1 | 0 | 0 |
| CMD | SRM | RM | - | - | RM | - | - |
| DIN | 10 | - | - | - | - | - | - |
| MAD | - | A | A | A | B | 12 | 11 |
| MEM | - | - | - | - | A | - | - |
| POUT(DATA) | - | - | A | A | A | B | B |
| TRANSFER | - | - | - | A | - | - | B |

Fig.11D

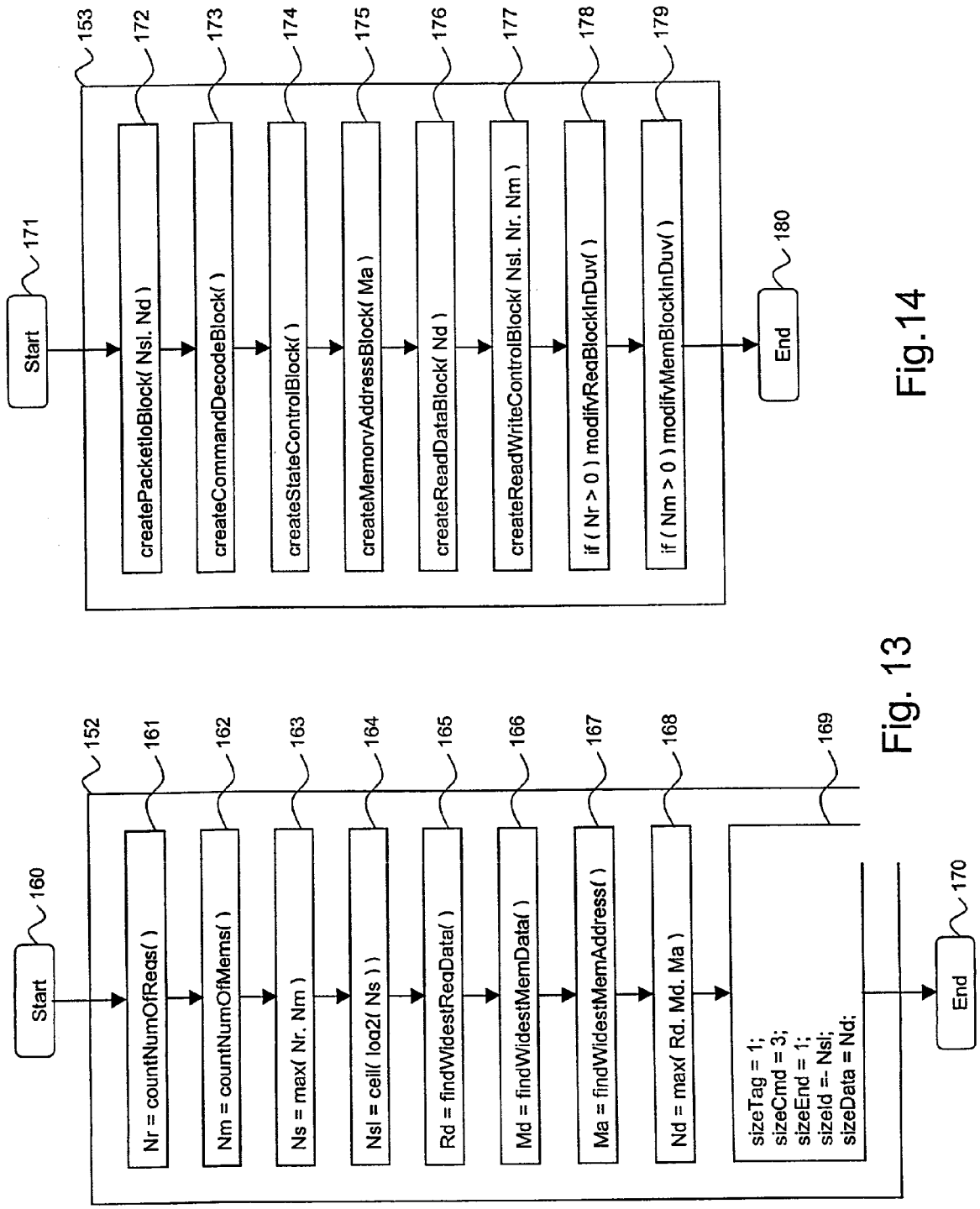

```
1   #define CMD_NOP  0   /* no operation          */
2   #define CMD_WR   2   /* write register        */
3   #define CMD_RR   3   /* read register         */
4   #define CMD_SWM  4   /* select write memory   */
5   #define CMD_WM   5   /* write memory          */
6   #define CMD_SRM  6   /* select read memory    */
7   #define CMD_RM   7   /* read memory           */
8
9   #define uint unsigned int
10
11  int sizeId;      /* size of ID field in bits */
12  int sizeData;    /* size of DATA field in bits */
13
14  uint tagOut = 0;    /* outgoing packet tag */
15  uint tagIn = 0;     /* incoming packet tag */
16
17  uint * packetOut;   /* outgoing packet */
18  uint * packetIn;    /* incoming packet */
19
20  extern void put_bits( uint *packet, int pos, int size, uint data );
21  extern void get_bits( uint *packet, int pos, int size, uint *data );
22  extern void copy_to_dbuff( int size, uint *packet );
23  extern void copy_from_dbuff( int size, uint *packet );
24  extern void transfer_to_haccel( int size );
25  extern void transfer_from_haccel( int size );
26
```

Fig.16

```
30  void sendPacket( uint cmd, uint end, uint id, int ds, uint data )
31  {
32      ps = 5 + sizeId + ds;
33      tagOut = tagOut ^ 1;
34      put_bits( packetOut, 0, 1, tagOut );
35      put_bits( packetOut, 1, 3, cmd );
36      put_bits( packetOut, 4, 1, end );
37      put_bits( packetOut, 5, sizeId, id );
38      put_bits( packetOut, 5+sizeId, ds, data );
39      copy_to_dbuff( ps, packetOut );
40      transfer_to_haccel( ps );
41  }
42
43  void receivePacket( int ds, uint *data )
44  {
45      ps = 5 + sizeId + ds;
46      while ( 1 ) {
47          transfer_from_haccel( ps );
48          copy_from_dbuff( ps, packetIn );
49          get_bits( packetIn, 0, 1, &tag );
50          if ( tag != tagIn ) break;
51      }
52      tagIn = tag;
53      get_bits( packetIn, 5+sizeId, ds, data );
54  }
55
```

Fig.17

```
60  void writeReg( uint rid, int ds, uint data )
61  {
62      sendPacket( CMD_WR, 0, rid, ds, data );
63  }
64
65  void readReg( uint rid, int ds, uint data )
66  {
67      sendPacket( CMD_RR, 0, rid, 0, NULL );
68      receivePacket( ds, &data );
69  }
70
71  void writeMem( uint mid, int as, uint start,
72                 int nw, int ds, uint *data )
73  {
74      sendPacket( CMD_SWM, 0, mid, as, start );
75      end = 0;
76      for ( i = 0; i < nw; i++ ) {
77          if ( i == (nw-1) ) end = 1;
78          sendPacket( CMD_WM, 0, end, ds, data[i] );
79      }
80  }
81
82  void readMem( uint mid, int as, uint start,
83                int nw, int ds, uint *data )
84  {
85      sendPacket( CMD_SRM, 0, mid, as, start );
86      end = 0;
87      for ( i = 0; i < nw; i++ ) {
88          if ( i == (nw-1) ) end = 1;
89          sendPacket( CMD_RM, 0, end, ds, data[i] );
90          receivePacket( ds, &data[i] );
91      }
92  }
```

Fig.18

HARDWARE-ASSISTED DESIGN VERIFICATION SYSTEM USING A PACKET-BASED PROTOCOL LOGIC SYNTHESIZED FOR EFFICIENT DATA LOADING AND UNLOADING

CROSS REFERENCE TO RELATED APPLICATIONS

This application claims the benefit of U.S. Provisional Application Ser. No. 60/242,407 filed on Oct. 20, 2000, the contents of which are incorporated herein by reference in their entirety.

FIELD OF THE INVENTION

This invention generally relates to digital hardware design verification systems and more particularly to hardware-assisted design verification systems that use a hardware accelerator for logic simulation.

BACKGROUND OF THE INVENTION

In modern electronics industry, many digital hardware designs are described in a hardware description language. For example, the IEEE standard 1364-1995 hardware description language defined in "IEEE Standard Hardware Description Language Based on the Verilog Hardware Description Language," published in 1996 by IEEE, is one of the popular hardware description languages. A digital hardware design written in such a hardware description language has to be verified for its intended functionality before it is compiled to generate the final netlist for manufacturing. This design verification task has long been associated with logic simulation.

A hardware-assisted design verification system uses a hardware accelerator to enhance the performance of logic simulation for a class of design verification tasks that require higher performance than a software-based verification system can provide. The hardware accelerator is a specialized logic simulation machine consisting of a large number of logic processors, each capable of simulating a logic gate. For example, the U.S. Pat. No. 4,306,286 "Logic Simulation Machine" issued Dec. 15, 1981 to Cocke et al. discloses such a logic simulation machine. It is noted that it is possible to perform verification without using such a hardware accelerator.

One type of hardware device useful as a hardware accelerator is the Cobalt™ product from Quickturn Design Systems, Inc., San Jose, Calif. (the assignee of the present invention). In a typical hardware-assisted design verification system, the hardware accelerator is connected to a host workstation, which runs a verification control program to load the compiled design under verification (also referred to herein as "DUV" or "user design") into the hardware accelerator, initiate logic simulation, terminate logic simulation, and unload the simulation results from the hardware accelerator. The user checks the simulation results against the expected results to see if the DUV has been simulated as expected. At the early stage of design verification, it is relatively easy for the user to find the problems in the DUV when the user finds the simulation results incorrect. It is, however, getting more difficult to debug the DUV at later design verification stages. Because of this problem, the user often wants to check the intermediate values of some key signals in the DUV during logic simulation. In order to satisfy such a requirement from the user, the design verification system provides support for signal visibility operations to make the signals in the DUV visible or accessible to the user during logic simulation.

It is easy for a software-based verification system to provide such support for signal visibility operations, but not very easy for a hardware-assisted verification system, since it requires extra communications between the host workstation and the hardware accelerator simulating the DUV.

Initial loading of the DUV into the hardware accelerator is usually done through a very general I/O interface like the SCSI interface. It is possible to use this I/O interface to access a small number of signals in the DUV during logic simulation. In that case, the interface control program in the hardware accelerator first identifies the requested signals, locates them, reads their values, and sends them back to the host workstation.

Signal visibility operations usually include not only operations to examine the intermediate value of a particular signal but also operations to deposit a logic value on the signal for subsequent simulation steps. Using these basic operations, the user can examine the value of a register or deposit a value on the register by accessing a group of signals corresponding to the register bits. By accessing a group of related registers, the user also can write data to or read data from a memory.

In order to take advantage of the advanced semiconductor chip technologies, an increasing number of DUVs include memories of large capacity. With the conventional signal visibility operations, it takes a long time to load data to or unload data from the large-capacity memories in the DUV, because the basic signal visibility operations are based on the low-level examine or deposit operations on individual signals.

To accelerate the loading and unloading operations for registers and memories in the DUV, a hardware-assisted design verification system can use a special communication channel between the host workstation and the hardware accelerator, dedicated for signal visibility operations. To minimize the overhead in accessing the requested signals in the DUV simulated on the hardware accelerator, the special communication channel is directly connected to the input and output data buffers, which in turn directly interfaces to the DUV without any interface control program.

One of the interface schemes with data buffering is disclosed in the U.S. Pat. No. 5,721,953 "Interface for Logic Simulation Using Parallel Bus for Concurrent Transfers and Having FIFO Buffers for Sending Data to Receiving Units When Ready" issued Feb. 24, 1998 to Fogg, Jr. et al., which discusses about the interface with a First-In-First-Out or FIFO buffer provided between the host computer and the logic simulation machine to minimize the interface delays. The disclosure of U.S. Pat. No. 5,721,953 is incorporated herein by reference in its entirety.

The output signals are assigned to the bits of the output data buffer, while the input signals are assigned to the bits of the input data buffer. For an examine operation (i.e., observing or reading the value of a signal), the verification control program initiates a data transfer to send the signal values stored in the output data buffer to the host workstation and selects the values of the requested signals. For a deposit operation (i.e., writing the value of a signal), the verification control program assembles the values to deposit and initiates a data transfer to send them to the input data buffer in the hardware accelerator. Additional wiring and logic components required for interfacing to the DUV are synthesized when the DUV is compiled for logic simulation.

The wiring and logic components synthesized for signal visibility operations are not part of the DUV, but virtual components merged with the DUV for logic simulation. Virtual logic components are often used for a testbench that generates inputs to the DUV and checks the simulation outputs, as described in a technical paper "The IBM Engineering Verification Engine" published by Beece et al. in the Proceedings of the 25th ACM/IEEE Design Automation Conference, June 1988, pages 218–224.

The static assignment of the input and output signals to the bits of the input and output data buffers is acceptable if the number of visible signals for signal visibility operations is relatively small. It is, however, not desirable for a large number of visible signals, because there is a limitation on the number of physically available data buffer bits.

One of the solutions to the problem of accessibility to signals within the DUV is to time-multiplex two or more signals for each bit in the data buffer to effectively increase the number of visible signals. One method of time-multiplexing multiple signals is disclosed in the U.S. Pat. No. 5,596,742, entitled "Virtual Interconnections for Reconfigurable Logic Systems" issued Jan. 21, 1997 to Agarwal et al., which discusses a compilation technique to intelligently multiplex each physical wire among multiple logical wires and pipelining these connections. Another time multiplexing method, which differs significantly from that disclosed in Agarwal, is disclosed in U.S. Pat. No. 5,960,191, entitled "Emulation System with Time-Multiplexed Interconnect" issued Sep. 28, 1999 to Sample et al., which discloses a hardware emulation system that time-multiplexes multiple design signals onto physical logic chip pins and printed circuit board. Another disclosure relating to time-multiplexing is disclosed in U.S. Pat. No. 6,020,760, entitled "I/O Buffer Circuit with Pin Multiplexing" issued Feb. 1, 2000 to Sample et al, which discloses an integrated circuit for implementing reconfigurable logic with an input/output buffer circuit time-multiplexing at least two signals onto an input/output pin to increase the effective I/O pin availability. U.S. Pat. Nos. 5,596,742, 5,960,191 and 6,020,760 are incorporated herein by reference in their entirety.

Although these time-multiplexing methods can effectively increase the number of visible signals through the data buffers, they do not address the performance issue in accessing the registers and memories in the DUV. Grouping of the signals required to access a register or memory can reduce the overhead incurred by gathering and scattering the bit values for the signals in a group. This signal grouping method may, however, impose severe restrictions on time-multiplexing multiple signals, because all the signals in a group have to be visible at the same time, and there may be many such signal groups, and there may be some signals shared by two or more groups.

With or without signal grouping, several steps are required to access one register using the low-level examine and deposit operations; more steps are required to access one memory word. Therefore, it is expected to take a very long time for the verification control program to load/unload a large number of data to/from a memory. Such time-consuming loading and unloading operations effectively degrade the overall simulation performance render the simulation much less effective, as fewer clock cycles will be simulated.

If a DUV contains many large-capacity memories, this performance degradation will become very serious, effectively nullifying the enhancement of simulation performance with the hardware accelerator. It would be desirable to provide a method and apparatus for reducing the time required for data loading and unloading. It would also be desirable to provide a method and apparatus for easier access to the registers and memories.

SUMMARY OF THE INVENTION

The present invention uses a new packet-based protocol to perform data transfer operations between the host workstation and the hardware accelerator for loading data to and unloading data from the registers and memories in a target design under verification (also known as the target design or user's design). The protocol is based on variable-size request and response packets. A request packet is an incoming packet from the host workstation to the hardware accelerator and includes a command, an argument, and optionally data, while a response packet is an outgoing packet from the hardware accelerator to the host workstation and includes read data from the target register or memory in the DUV.

In an aspect of one of the embodiments of the present invention, a method for compiling a user's design is disclosed where all the memories and registers in the user's design are identified. After the memories and registers are identified, accesibility logic is synthesized into the user's design. The accessibility logic comprises access ports to the memories and registers. In another aspect of the present inventions, a unique identifier is assigned to each of the memories and registers in the user's design. In yet another aspect of the present invention, the accessibility logic comprises selecting logic. This selecting logic is adapted to receive the unique identifier and select a particular one of the memories or registers in the user's design. In another aspect of the present invention, the accessibility logic comprises logic to read from or write to the particular one of the memories or registers in the user's design. In yet another aspect of the present invention, the accessibility logic comprises decode logic that receives commands from a host and controls execution of reading and writing of data to the memories and registers in the user's design.

In order to handle the request and response packets, a protocol interface logic is synthesized at compile time with the size parameters of the registers and memories in the target DUV and is simulated with the target DUV at run time. The synthesized protocol interface logic includes packet registers, a finite state machine, a command decode logic, a command execution logic, and a data read and write control logic for data loading and unloading operations. It decodes a request packet from the verification control program running on the host workstation and executes the command encoded in the packet. If the command is a data write request, the protocol interface logic writes the data in the packet into the target register or memory location. If the command is a data read request, the protocol interface logic reads data from the target register or memory location and sends it in a response packet to the host workstation.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

FIG. 4 is a detailed block diagram of the memory address block of the protocol interface logic.

FIG. 5 is a detailed block diagram of the read data block of the protocol interface logic.

FIG. 6 is a chart of protocol commands handled by the protocol interface logic.

FIG. 11A is a timing chart of the execution of register write commands in the protocol interface logic.

FIG. 11B is a timing chart of the execution of register read commands in the protocol interface logic.

FIG. 11C is a timing chart of the execution of memory write commands in the protocol interface logic.

FIG. 11D is a timing chart of the execution of memory read commands in the protocol interface logic.

FIG. 13 is a detailed flow chart of the computation of the protocol field sizes for the protocol interface logic.

FIG. 14 is a detailed flow chart of the construction of the components of the protocol interface logic.

FIG. 16 is a code listing of the definitions and declarations of constants, variables, and functions used to describe the operations with the protocol interface logic.

FIG. 17 is a code listing of the functions for sending packets to and receiving packets from the protocol interface logic.

FIG. 18 is a code listing of the functions to write register, read register, write memory, and read memory with the protocol interface logic.

DETAILED DESCRIPTION OF THE INVENTION

Turning to the figures, the presently preferred apparatus and methods of the present invention will now be described.

Figure 19:
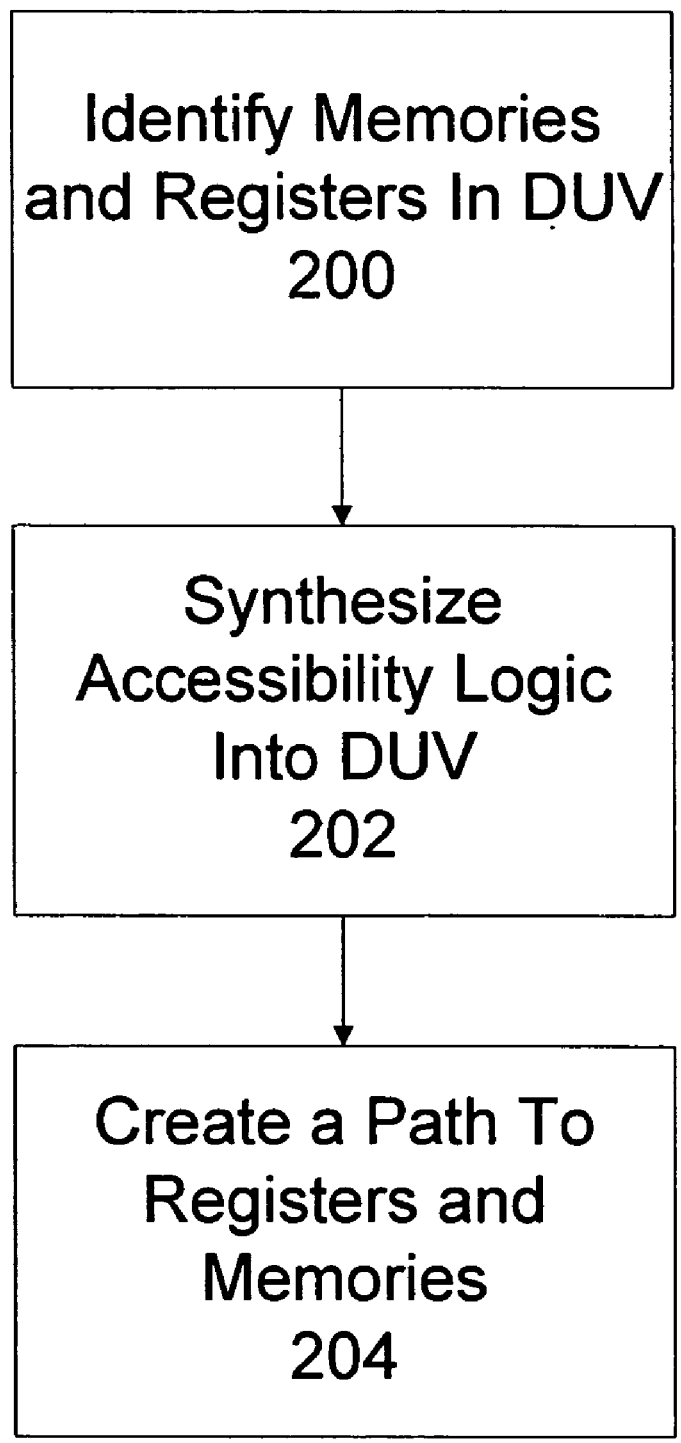
FIG. 19 is a flow chart showing a preferred method of providing improved access to memories and registers.

FIG. 19 is a flow chart showing a presently preferred method of the invention. The first step 200 shown in FIG. 19 is to identify memories and registers present in the DUV. In one embodiment, this first step 200 involves identifying all of the memories and registers of the DUV. In another embodiment, this first step 200 involves identifying only a subset of the memories and registers present in the DUV. In this embodiment, the user must identify those memories and registers that are of particular concern or interest. An advantage to only identifying a subset of the memories and registers of the DUV is that the DUV can be compiled for verification more quickly. However, by only identifying a subset of the memories and registers, the advantages provided by the various embodiments of the present invention will be limited to those specific memories and registers identified. As will be discussed in more detail below, once the memories and registers have been identified, they must be indexed so that each identified memory and register has a unique identifier.

The second step 202 shown in FIG. 19 is to synthesize logic that will be added to the DUV. This synthesized logic will provide access to the registers and memories identified in the first step 200. The logic synthesized in this second step 202 will be discussed in detail below. In general, however, this synthesized logic will comprise selecting logic that receives the unique identifier discussed above so that a particular memory or register can be accessed for reading or writing.

The third step 204 shown in FIG. 19 is the step of creating a path to the registers and memories. This step will also be discussed in greater detail below.

Figure 1:
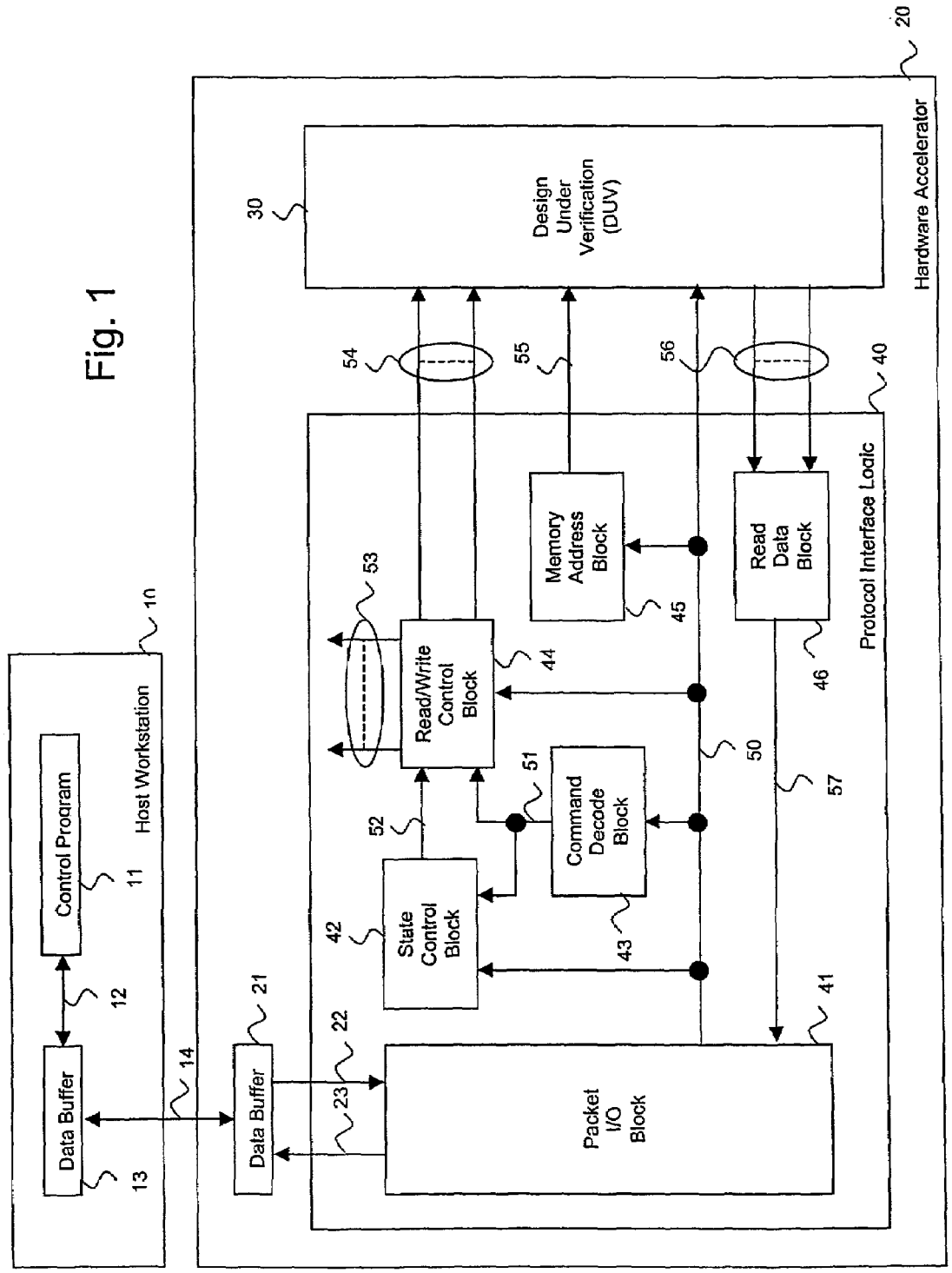
FIG. 1 is a block diagram of the subject system illustrating the protocol interface logic synthesized for an example design under verification or DUV.

FIG. 1 is a block diagram of a preferred embodiment of the present invention. FIG. 1 shows both the design under verification (DUV) 30, along with the logic synthesized to provide much better access to the memories and registers of the DUV 30. FIG. 1 shows a host workstation 10 connected via a communication channel 14 to a hardware accelerator 20, which simulates a design under verification (DUV) 30, and the protocol interface logic 40 synthesized for the DUV 30 for efficient data loading and unloading operations. A control program 11 is a verification control program that runs on the host workstation 10 to load data into and unload data from the registers and memories in the DUV 30 through the protocol interface logic 40. An exemplary hardware accelerator 20 is the Cobalt™ product available from Quickturn Design Systems, Inc. An exemplary control program 11 is the PowerSuite™ software package, available from Quickturn Design Systems, Inc.

When the control program 11 loads data into a register or memory location in the DUV 30, it first sends a write command with data into the data buffer 13 via an internal bus 12 and then initiates a data transfer from the data buffer 13 to a data buffer 21 in the hardware accelerator 20 via the communication channel 14. The protocol interface logic 40 receives the write command and write data from the data buffer 21 and executes the write command to load the data into the target register or memory location in the DUV 30.

When the control program 11 unloads data from a register or memory location in the DUV 30, it first sends a read command into the data buffer 13 via the internal bus 12 and then initiates a data transfer from the data buffer 13 to the data buffer 21 in the hardware accelerator 20 via the communication channel 14. The protocol interface logic 40 receives the read command from the data buffer 21 and executes it to unload data from the target register or memory location in the DUV 30 into the data buffer 21. The data stored in the data buffer 21 is then transferred to the data buffer 13 via the communication channel 14 by the transfer operation initiated by the control program 11, which receives the data from the data buffer 13 via the internal bus 12.

As discussed, the protocol interface logic 40 is a special logic synthesized for the DUV 30. In a presently preferred embodiment, protocol interface logic 40 comprises packet I/O block 41, state control block 42, command decode block 43, read/write control block 44, memory address block 45, and read data block 46.

The packet I/O block 41 holds command and write data from the host workstation 10 in its incoming packet register (not shown in FIG. 1). Packet I/O block 41 also holds information and read data from the DUV 30 in its outgoing packet register (not shown in FIG. 1). The packet I/O block 41 receives command and write data signals 22 from the data buffer 21 and read data signals 57 from the read data block 46. The packet I/O block 41 sends control information and read data signals 23 to the data buffer 21 and command and data signals 50 to the state control block 42, command decode block 43, read/write control block 44, memory address block 45, and DUV 30.

The state control block 42 holds the current state of the protocol interface logic 40 and makes state transitions. The state control block 42 receives decoded command information signals 51 from the command decode block 43 and command signals 50 from the packet I/O block 41. The state control block 42 generates state signals 52 to the read/write control block 44.

The command decode block 43 decodes a command from the packet I/O block 41. The command decode block 43 receives the command signals 50 from the packet I/O block 41 and generates the decoded information signals 51 to the state control block 42 and read/write control block 44.

The read/write control block 44 generates the internal and external read and write control signals. The read/write control block 44 receives the decoded command information signals 51 from the command decode block 43, the state information signals 52 from the state control block 42, and the write data signals 50 from the packet I/O block 41. The read/write control block 44 generates read and write control signals 53 internal to the protocol interface logic 40 and read and write control signals 54 to the register and memory blocks in the DUV 30.

The memory address block 45 holds a memory address and updates it for memory access operations. The memory address block 45 receives memory address signals 50 from the packet I/O block 41 and generates current memory address signals 55 to the DUV 30.

The read data block 46 receives data signals 56 from the registers and memories in the DUV 30 and generates selected data signals 57 to the packet I/O block 41.

Figure 2A:
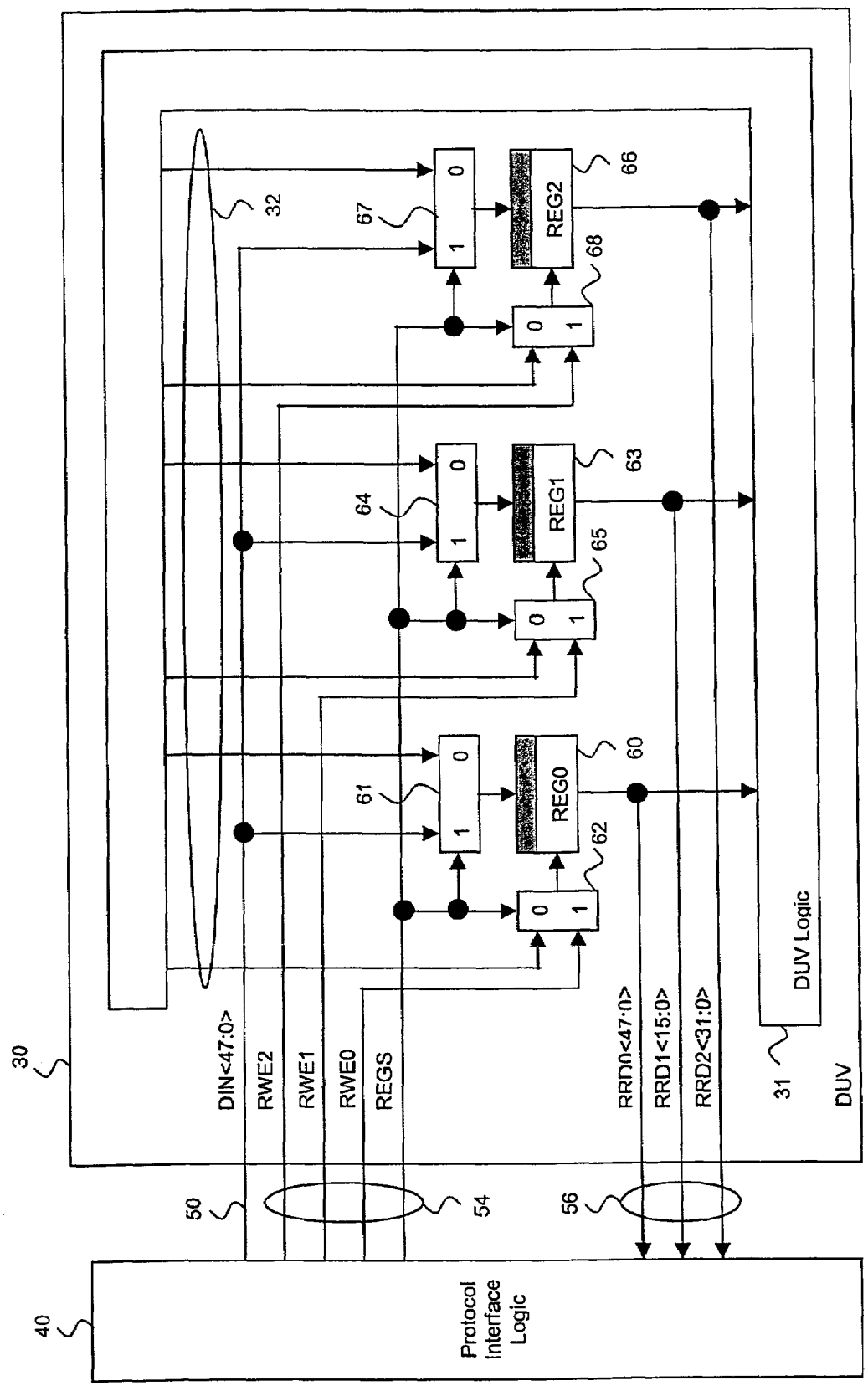
FIG. 2A is a block diagram of the register blocks in the example DUV coupled with the protocol interface logic.

FIG. 2A shows three example registers REG0, REG1, and REG2, which are present in an exemplary DUV 30, and the access logic that is synthesized into the DUV 30 to allow reading and writing to those registers. Registers REG0, REG1, and REG2 would have been identified in step 200 discussed above with reference to FIG. 19. In this example, registers REG0, REG1, and REG2 are 48-bit, 16-bit, and 32-bit registers 60, 63, and 66, respectively, which allows demonstration of the flexibility of the various embodiments of the present invention. In the DUV 30, registers REG0, REG1, and REG2 receive write data and control signals 32 from the DUV logic 31 and generate read data signals 56 to the DUV logic 31. Data multiplexers 61, 64, and 67 and control multiplexers 62, 65, and 68 are synthesized and added to the DUV 30 so that the protocol interface logic 40 can load data into and unload data from registers REG0, REG1, and REG2. The multiplexers 61, 62, 64, 65, 67, and 68 are controlled by the select signal REGS in the signal group 54 from the protocol interface logic 40. RWE0, RWE1, and RWE2 are the register write control signals in the signal group 54 from the protocol interface logic 40 and are connected to the control multiplexers 62, 65, and 68, respectively. DIN<47:0> is a 48-bit data signal group 50 from the protocol interface logic 40 and is connected to the data multiplexers 61, 64, and 67. RRD0<47:0> is a 48-bit data signal group from REG0, RRD1<15:0> is a 16-bit data signal group from REG1, and RRD2<31:0> is a 32-bit data signal group from REG2. RRD0, RRD1, and RRD2 are connected as the signal group 56 to the DUV logic 31 and the protocol interface logic 40.

When the select signal REGS is not asserted, REG0, REG1, and REG2 receive write data and control signals 32 from the DUV logic 31. When the select signal REGS is asserted, REG0, REG1, and REG2 receive write data signals 50 and control signals 54 from the protocol interface logic 40. Regardless of the select signal REGS, the read data signals 56 are sent to the DUV logic 31 and the protocol interface logic 40.

Figure 2B:
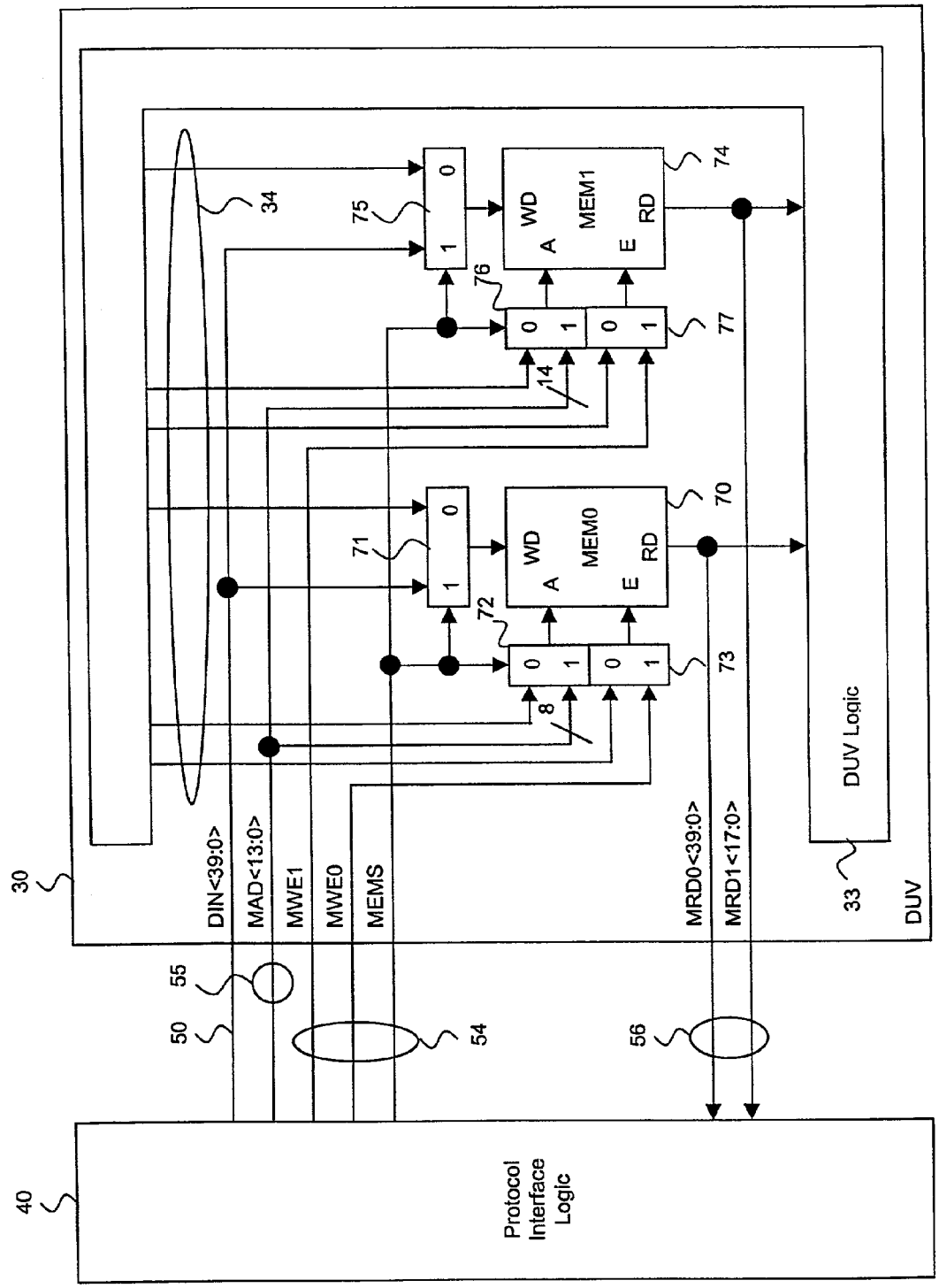
FIG. 2B is a block diagram of the memory blocks in the example DUV coupled with the protocol interface logic.

FIG. 2B shows two example memories MEM0 and MEM1 in the DUV 30, which are present in an exemplary DUV 30, and the access logic that is synthesized into the DUV 30 to allow reading and writing to those memories. Memories MEM0 and MEM1 would have been identified in step 200 discussed above with reference to FIG. 19. MEM0 is a memory 70 with a 40-bit data and 8-bit address while MEM1 is a memory 74 with an 18-bit data and 14-bit address. These data sizes and address lengths are selected so as to illustrate the flexibility of the invention and not to limit the type of memories that can be present in the DUV 30. In the DUV 30, MEM0 and MEM1 receive write data, memory address, and write enable signals 34 from the DUV logic 33 and generate read data signals 56 to the DUV logic 33. Data multiplexers 71 and 75, address multiplexers 72 and 76, and write enable multiplexers 73 and 77 are synthesized and added to the DUV 30 so that the protocol interface logic 40 can load data to and unload data from MEM0 and MEM1. The multiplexers 71, 72, 73, 75, 76, and 77 are controlled by the select signal MEMS in the signal group 54 from the protocol interface logic 41. MWE0 and MWE1 are the memory write enable signals in the signal group 54 from the protocol interface logic 40 and are connected to the write enable multiplexers 73 and 77, respectively. DIN<39:0> is a 40-bit data signal group 50 from the protocol interface logic 40 and is connected to the data multiplexers 71 and 75. MAD<13:0> is a 14-bit address signal group 55 from the protocol interface logic 40 and is connected to the address multiplexers 72 and 76. MRD0<39:0> is a 40-bit data signal group from MEM0, and MRD1<17:0> is a 18-bit data signal group from MEM1. MRD0 and MEM1 are connected as the signal group 56 to the DUV logic 33 and the protocol interface logic 40.

When the select signal MEMS is not asserted, memories MEM0 and MEM1 receive write data, memory address, and write enable signals 34 from the DUV logic 33. When the select signal MEMS is asserted, MEM0 and MEM1 receive write data signals 50, memory address signals 55, and write enable signals 54 from the protocol interface logic 40. Regardless of the select signal MEMS, the read data signals 56 are sent to the DUV logic 33 and the protocol interface logic 40.

Figure 3:
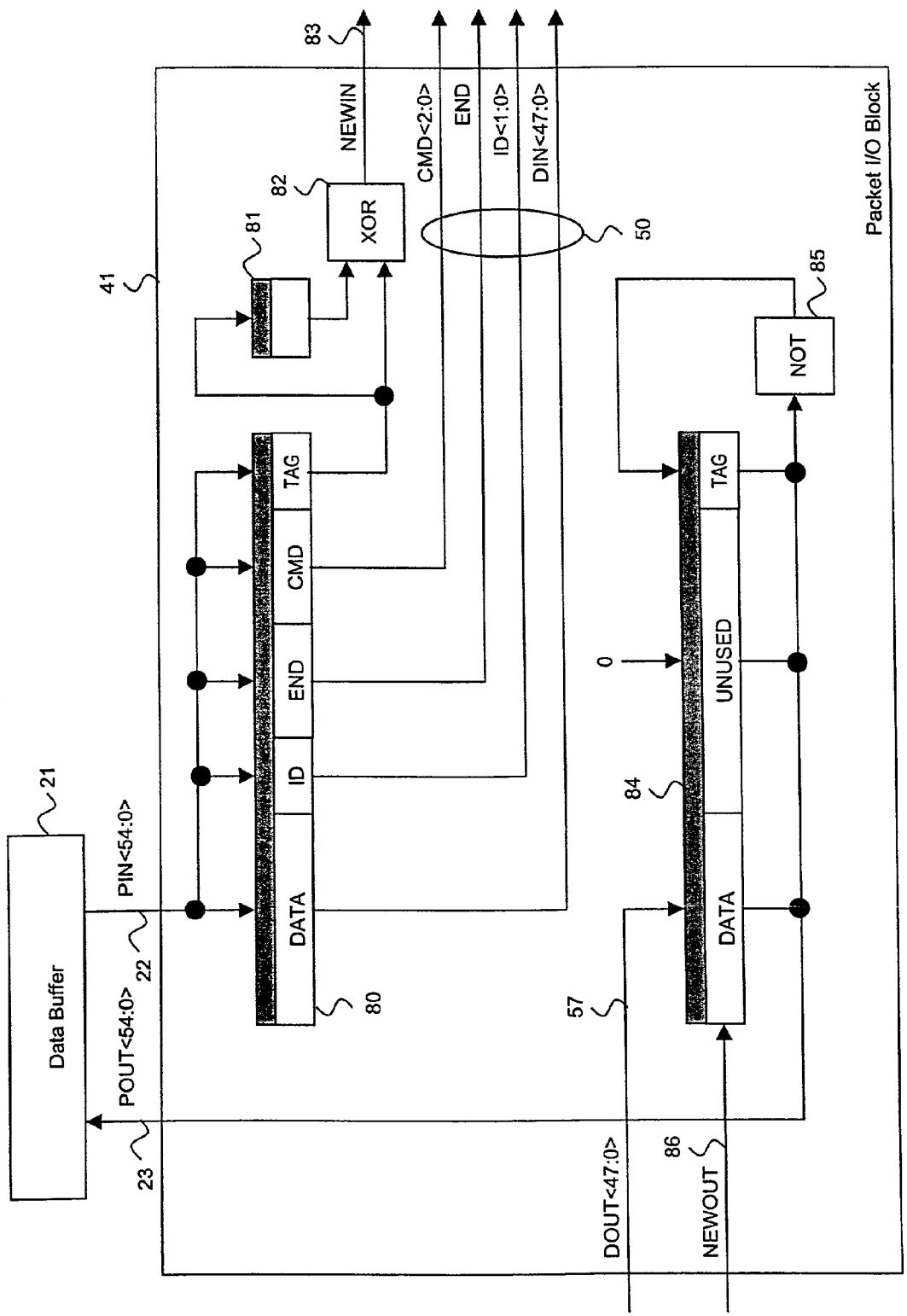
FIG. 3 is a detailed block diagram of the packet I/O block of the protocol interface logic.

FIG. 3 is a detailed block diagram of the packet I/O block 41 in the protocol interface logic 40. A request packet in the data buffer 21 is moved via signals 22 to an incoming packet register 80 for command execution. In a presently preferred embodiment, the request packet stored in the register 80 is divided into five fields: the 1-bit TAG, 3-bit CMD, 1-bit END, 2-bit ID, and 48-bit DATA fields. The length of these fields is not limited to these particular lengths and can be established by the needs of a particular system. The values in the CMD, END, ID, and DATA fields are sent on signals 50 to the other blocks. The value in the TAG field is sent to a 1-bit register 81, which holds the TAG value of the previous cycle. The value in the TAG field in the register 80 is checked against the previous TAG value stored in the register 81 at the exclusive-OR gate 82 to generate NEWIN on a signal 83 to indicate whether a new packet has arrived in the register 80. If NEWIN is one, the register 80 has received a new packet from the data buffer 21. Although the size of the TAG field in this particular embodiment is 1 bit in the exemplary packet I/O block 41 of FIG. 3, it can be more than 2 bits. In this case, the exclusive-OR gate 82 has to be replaced by an appropriate logic block to check the equality of the two values.

A response packet is stored in an outgoing packet register 84, and then moved on signals 23 to the data buffer 21. In this particular embodiment, the response packet in the register 84 is divided into three fields: 1-bit TAG, 6-bit UNUSED, and 48-bit DATA fields. The length of these fields is not limited to these particular lengths and can be established by the needs of a particular system. The value on signals 57 is stored into the DATA field in the register 84. The value in the UNUSED field is not used and always zero. The value of the TAG field is toggled by the NOT gate 85. NEWOUT on a signal 86 controls the register 84 so that the register 84 stores a new data and a new tag bit only when NEWOUT is asserted. Although in this particular embodiment, the size of the TAG field is 1 bit in the exemplary packet I/O block 41, it can be more than 2 bits. In this case, the NOT gate 85 has to be replaced by an appropriate logic block to update the TAG field value.

FIG. 4 is a detailed block diagram of a presently preferred embodiment of the memory address block 45 in the protocol interface logic 40. A register 90 holds a 14-bit memory address, which comes through an address multiplexer 91. The multiplexer select signal MADS and the register control signal MADE come on signals 53. When MADS is zero, the multiplexer 91 selects the address incremented by an address incrementer 92. When MADS is one, the multiplexer selects a memory address on DIN<13:0> on signals 50. The current memory address MAD<13:0> held in the register 90 is sent on signals 55 to the DUV 30.

FIG. 5 is a detailed block diagram of a presently preferred read data block 46 in the protocol interface logic 40. Three register read data RRD0<47:0>, RRD1<15:0>, and RRD2<31:0> are sent on signals 56 to a register data multiplexer 93, which is controlled by RRDS<1:0> on signals 53. The values 0, 1, and 2 of RRDS<1:0> select RRD0, RRD1, and RRD2, respectively. Two memory read data MRD0<39:0> and MRD1<17:0> are sent on signals 56 to a memory data multiplexer 94, which is controlled by MRDS on signals 53. The values 0 and 1 of MRDS select MRD0 and MRD1, respectively. The data from the multiplexers 93 and 94 are sent to another data multiplexer 95, which is controlled by a select signal MRS. The values 0 and 1 of MRS select the output of the multiplexer 93 and the output of the multiplexer 94, respectively. The output of the multiplexer 95 is the final read data sent on signals 57 to the packet I/O block 41.

FIG. 6 is a chart of presently preferred protocol commands decoded and executed by the protocol interface logic 41. As illustrated in FIG. 3, a request packet stored in the incoming packet register 80 from the data buffer 21 is divided into 5 fields. The 3-bit CMD field encodes 7 commands. The NOP (No Operation) command is specified by CMD=0 or 1 and does not do anything but consumes at least one clock cycle. The WR (Write Register) command is specified by CMD=2 and writes the target register specified by the register ID or Rid in the ID field with the write data in the DATA field. The RR (Read Register) command is specified by CMD=3, reads data in the target register specified by the register ID or Rid in the ID field, and stores it in the DATA field in the outgoing packet register 84.

The SWM (Select Write Memory) and WM (Write Memory) commands are used for loading data into a memory in a continuous mode. The SWM command is specified by CMD=4 and stores the memory ID or MID in the ID field into the memory ID register 130 in FIG. 10 and the start address in the DATA field into the memory address register 90 in FIG. 4. The execution of the SWM command puts the protocol interface logic 40 in the memory write mode. The WM command is specified by CMD=5 and writes the write data in the DATA field into the target memory indicated by the memory ID register 130; the target write memory address is the address stored in the memory address register 90. When the WM command writes the last data into the target memory, value one is put in the END field; value zero, otherwise. When the protocol interface logic 40 is in the memory write mode, the WM command is the only command accepted and executed. The last data indication of the END field puts the protocol interface logic 40 back in the normal non-memory mode.

The SRM (Select Read Memory) and RM (Read Memory) commands are used for unloading data from a memory in a continuous mode. The SRM command is specified by CMD=6 and stores the memory ID or MID in the ID field into the memory ID register 130 and the start address in the DATA field into the memory address register 90. The execution of the SRM command puts the protocol interface logic 40 in the memory read mode. The RM command is specified by CMD=7 and reads data from the target memory indicated by the memory ID register 130; the target read memory address is the address stored in the memory address register 90. The data read from the target memory location is stored in the DATA field of the outgoing packet register 84. When the RM command reads the last data from the target memory, value one is put in the END field; value zero, otherwise. When the protocol interface logic 40 is in the memory read mode, the RM command is the only command accepted and executed. The last data indication of the END field puts the protocol interface logic 40 back in the normal non-memory mode.

The execution of each WM or RM command increments the memory address by 1, as illustrated in FIG. 4. The first memory address is stored by the SWM or SRM command. The first WM command after the SWM command writes the memory location indicated by the memory address stored in the memory address register 90, and the second WM command writes the next memory location, and so on. Similarly, the first RM command after the SRM command reads the memory location indicated by the memory address stored in the memory address register 90, the second RM command reads the next memory location, and so on.

Figure 7:
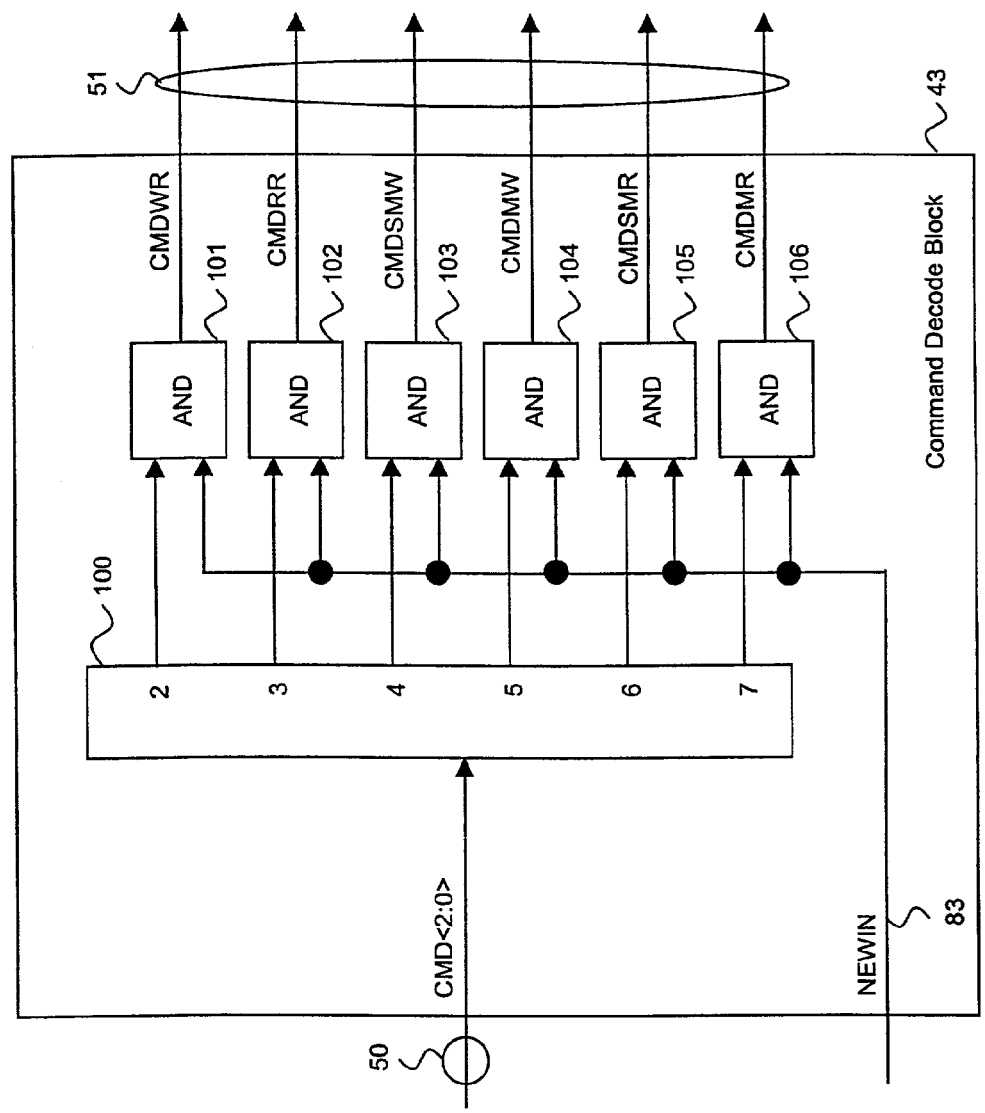
FIG. 7 is a detailed block diagram of the command decode block of the protocol interface logic.

FIG. 7 is a detailed block diagram of a presently preferred command decode block 43 in the protocol interface logic 40. CMD<2:0> on signals 50 from the CMD field of the incoming packet register 80 is sent to a decoder 100 to generate 6 signals, which are ANDed with NEWIN on the signal 83 to generate the WR command signal CMDWR at an AND gate 101, the RR command signal CMDRR at an AND gate 102, the SMW command signal CMDSMW at an AND gate 103, the WM command signal CMDWM at an AND gate 104, the SRM command signal CMDSRM at an AND gate 105, and the RM command signal CMDRM at an AND gate 106, all sent on signals on 51 to the other blocks.

Figure 8:
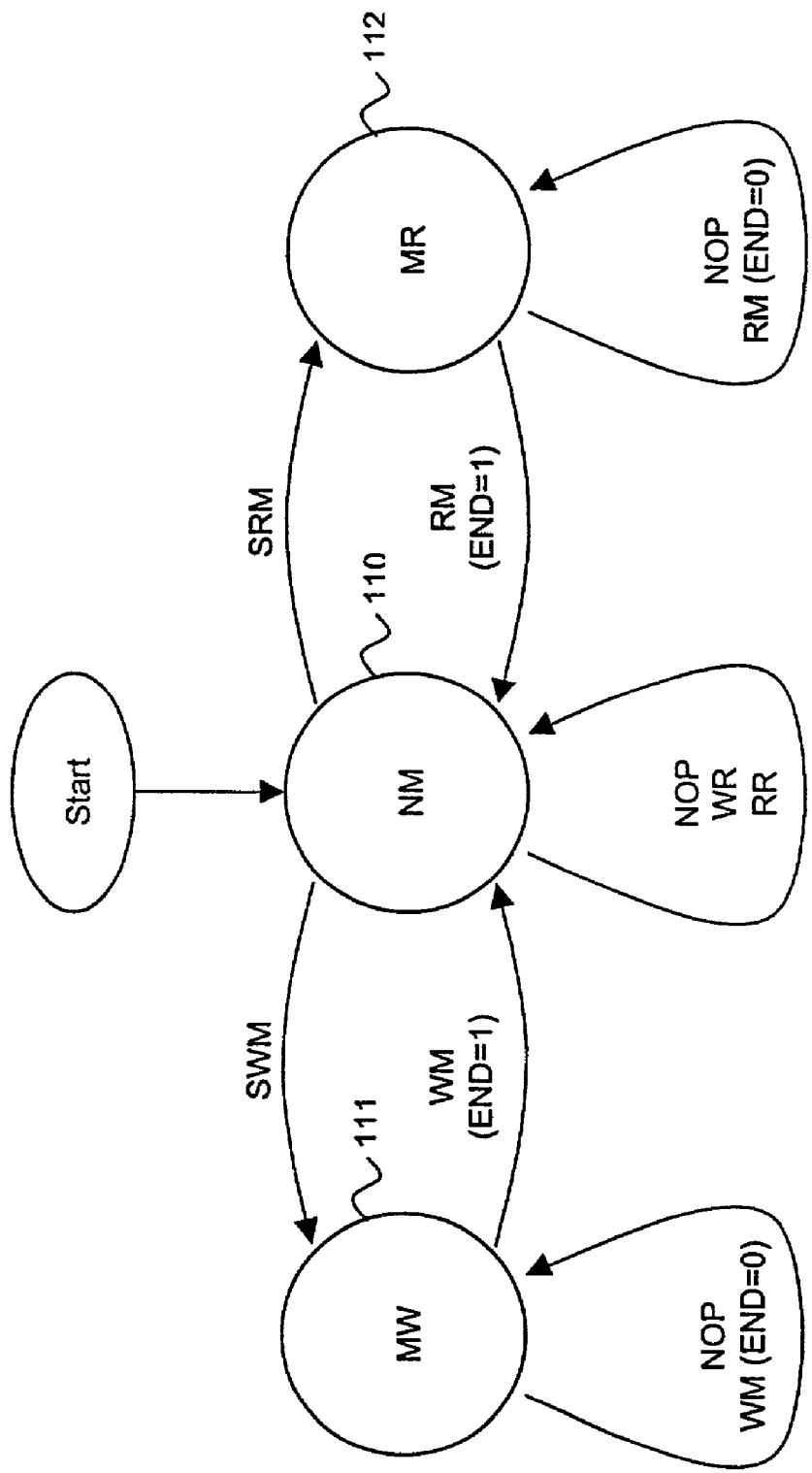
FIG. 8 is a diagram of the states and state transitions of the protocol interface logic.

FIG. 8 is a diagram of the states and state transitions of the protocol interface logic 40. There are three states: NM (Non-Memory), MW (Memory Write), and MR (Memory Read) states, indicated by 110, 111, and 112, respectively. When simulation starts on the hardware accelerator 20, the protocol interface logic 40 goes into the NM state. The execution of the NOP, WR, and RR commands does not change the state. The execution of the SWM command in the NM state changes the state from NM to MW. The execution of a WM command with END=0 and a NOP command does not change the state; the execution of a WM command with END=1 changes the state from MW to NM. The execution of the SRM command in the NM state changes the state from NM to MR. The execution of a RM command with END=0 and a NOP command does not change the state; the execution of a RM command with END=1 changes the state from MR to NM.

Figure 9:
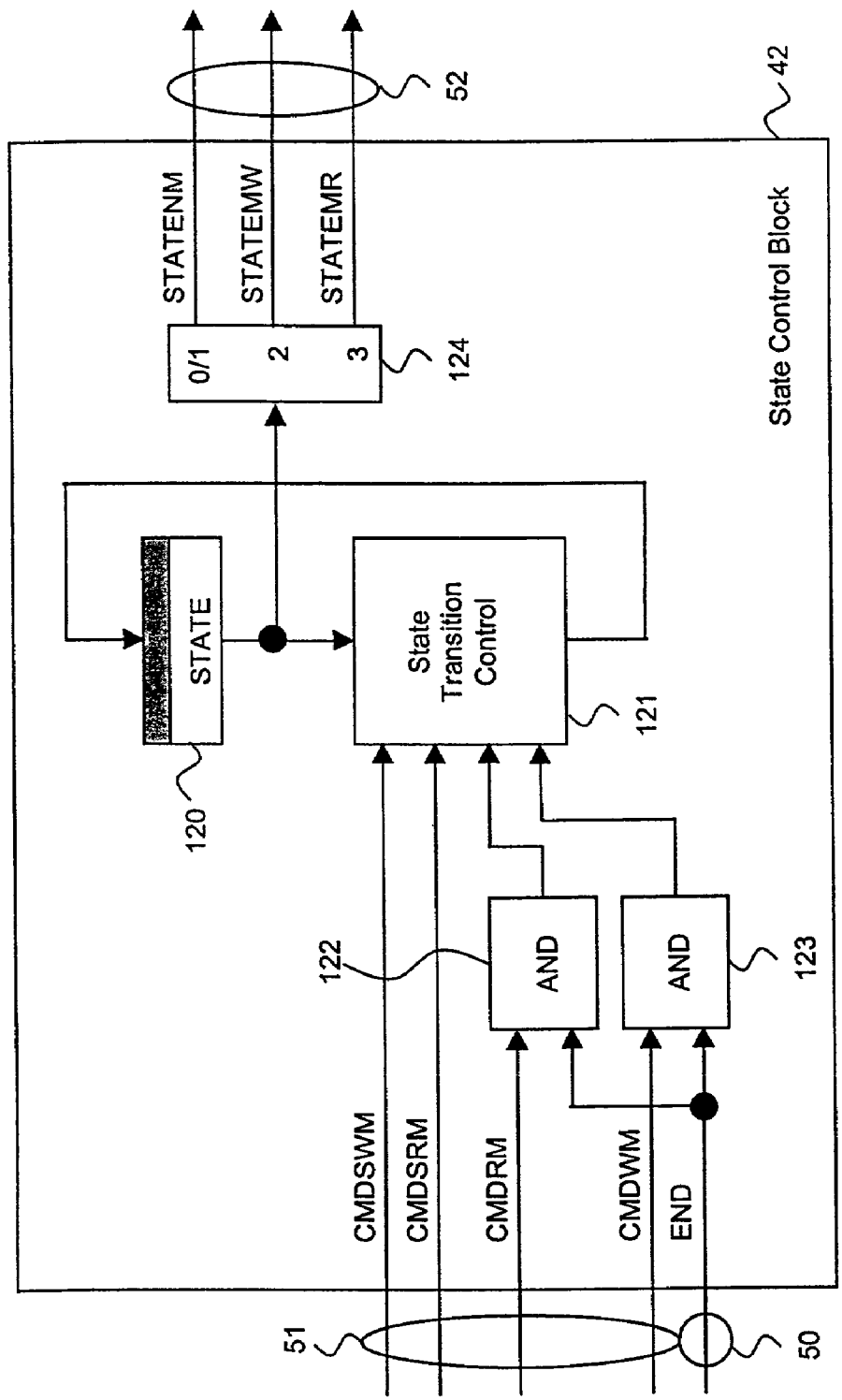
FIG. 9 is a detailed block diagram of the state control block of the protocol interface logic.

FIG. 9 is a detailed block diagram of a presently preferred state control block 42 in the protocol interface logic 40. The current state STATE is stored in a state register 120 and is sent to the state transition control 121 to generate the next state to be stored back in the state register 120. The input signals to the state transition control 121 include CMDSWM and CMDSRM on the signals 51, the signal generated by ANDing CMDRM on the signals 51 and END on the signals 50 at the AND gate 122, and the signal generated by ANDing CMDWM on the signals 51 and END on the signals 50 at the AND gate 123. The state transition control 121 realizes the state transitions illustrated in FIG. 8. The current state STATE is decoded at a decoder 124 to generate three state signals STATENM, STATEMW, and STATEMR on signals 52.

Figure 10:
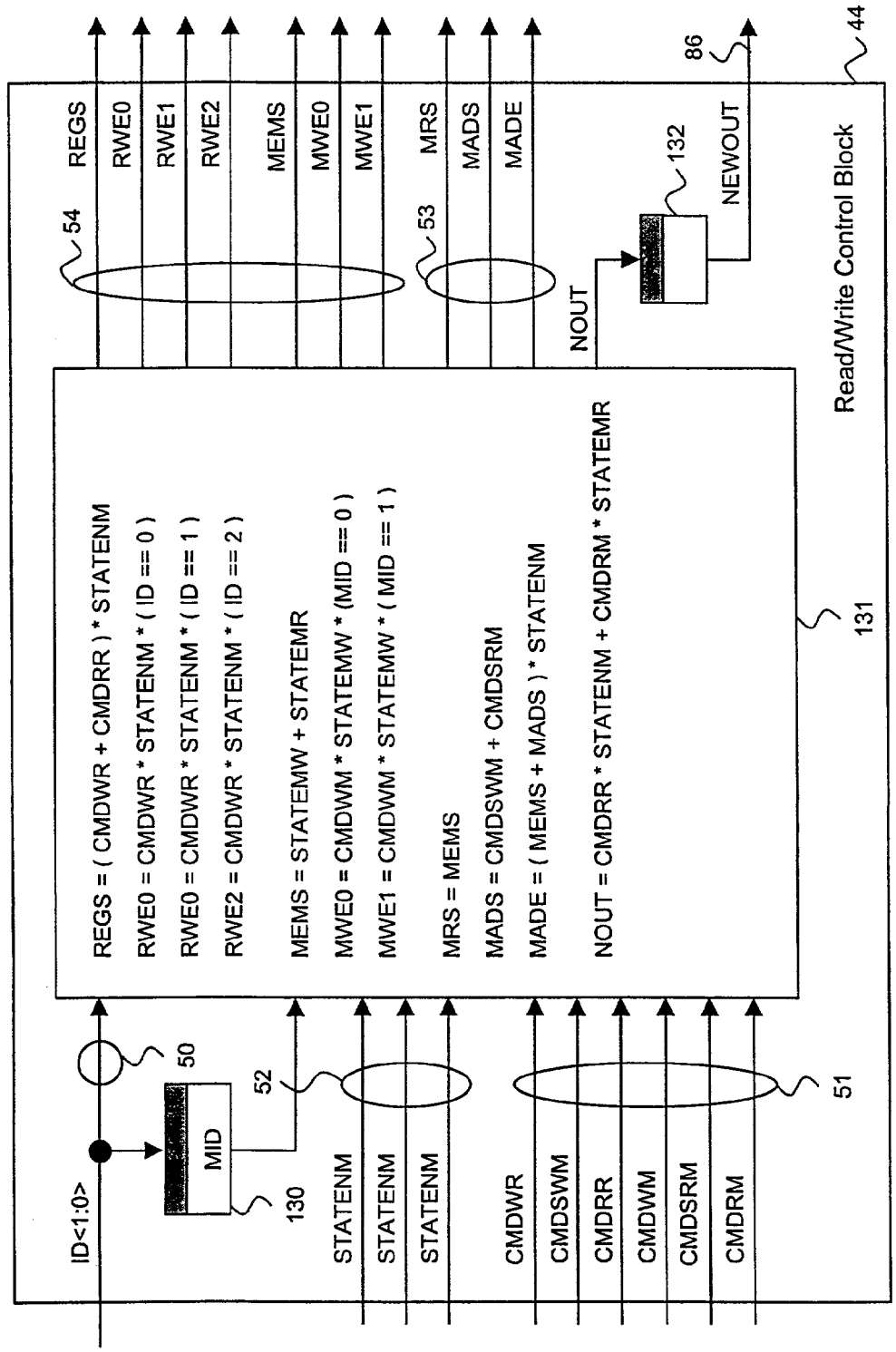
FIG. 10 is a detailed block diagram of the read/write control block of the protocol interface logic.

FIG. 10 is a detailed block diagram of a presently preferred read/write control block 44 in the protocol interface logic 40. The read/write control block 44 generates the output control signals 54, 53, and 86 from the input signals 50, 52, and 51. ID<1:0> on the signals 50 from the ID field of the incoming packet register 80 are sent to a control logic 131 and to a memory ID register 130. The output MID from the memory ID register 130 is also sent to the control logic 131. The control logic 131 generates the register read data select signal REGS by (CMDWR+CMDRR)*STATENM, the register write enable 0 signal RWE0 by CMDWR*STATENM*(ID==0), the register write enable 1 signal RWE1 by CMDWR*STATENM*(ID==1), the register write enable 2 signal by CMDWR*STATENM*(ID==2), the memory read data select signal MEMS by STATEMW+STATEMR, the memory write enable 0 signal MWE0 by CMDWM*STATEWM*(MID==0), the memory write enable 1 signal MWE1 by CMDWM*STATEWM*(MID==1), the memory/register select signal MRS by MEMS, the memory address select signal MADS by (CMDSWM+CMDSRM)*STATENM, the memory address enable signal MADE by MEMS+MADS, and NOUT by CMDRR*STATENM+CMDRM *STATEMR, where "+" is a logical OR operator, "*" is a logical AND operator, and "==" is an equality operator. REGS, RWE0, RWE1, RWE2, MEMS, MWE0, and MWE1 from the control logic 131 are sent on the signals 54 to the outside. MRS, MADS, and MADE from the control logic 131 are sent on the signals 53 to the outside. NOUT from the control logic 131 is stored in a 1-bit register 132, and the output from the register 132 is NEWOUT sent on the signal 86 to the outside.

FIG. 11A is an example timing chart of the execution of register write commands in the protocol interface logic 40. Rows 140 (CYCLE), 141 (NEWIN), 142 (CMD), 143 (DIN), and 144 (REG) show the clock cycles, the values of the NEWIN signal, the commands, the write data, and the values of the target register, respectively. Four WR commands arrive at cycles N, N+1, N+3, and N+4 with write data A, B, C, and D, respectively. The write data A, B, C, and D are stored into the target register at cycles N+1, N+2, N+4, and N+5, respectively. In this example timing chart, it is assumed that the execution of a WR command takes one cycle. If it takes two or more cycles to execute a WR command, a simple control logic is required to block the execution of the next command until the execution of the WR command is complete.

FIG. 11B is an example timing chart of the execution of register read commands in the protocol interface logic 40. Rows 145 (POUT) and 146 (TRANSFER) show the read data stored in the outgoing packet register 84 and the data transferred from the hardware accelerator 20 to the host workstation 10, respectively. The RR command that arrives at cycle N reads data A from the target register and stores it into the DATA field of the outgoing packet register 84 at cycle N+1. The data transfer at cycle N+2 sends the response packet with the register data in the outgoing packet register 84 via the data buffer 21 to the host workstation 10. The RR command that arrives at cycle N+3 reads data B from the target register and stores it into the DATA field of the outgoing packet register 84 at cycle N+4. The data transfer at cycle N+5 sends the response packet with the register data in the outgoing packet register 84 via the data buffer 21 to the host workstation 10. In this example timing chart, it is assumed that the execution of a RR command takes one cycle. If it takes two or more cycles to execute a RR command, a simple control logic is required to block the execution of the next command until the execution of the RR command is complete.

The data transfer of the response packet stored in the outgoing packet register is initiated by the verification control program 11 running on the host workstation 10. In this example timing chart, it is assumed for simplicity that the verification control program 11 knows when to initiate the data transfer to obtain the read data after sending a RR command. If the verification control program has no way to know when to initiate the data transfer, then it has to repeat data transfer operations until it receives a response packet with the TAG field value different from the previous TAG field value, indicating that the packet contains a new read data. Since the verification control program 11 knows in advance that the protocol interface logic can make the register data ready in the outgoing packet register 84 one cycle after it executes a RR command, it can send one NOP command after the RR command and then initiate the data transfer so that the verification control program 11 can receive the register data in the response packet. Or the verification control program 11 can also send one command with no TAG field value updated, which is effectively equivalent to a NOP command that consumes at least one clock cycle, and then initiate the data transfer.

FIG. 11C is an example timing chart of the continuous-mode memory write operations in the protocol interface logic 40. Rows 147 (MAD) and 148 (MEM) show the memory address and the data of the target memory, respectively. The SWM command that arrives at cycle N stores the first write memory address 10 into the memory address register 90 at cycle N+1. The protocol interface logic 40 goes into the memory write mode at cycle N+1. The first WM command arrives with write data A at cycle N+1. The write data A is stored at the memory location 10 of the target memory at cycle N+1. The memory address is incremented by 1 at cycle N+1, and the updated memory address 11 is stored into the memory address register 90 at cycle N+2. The second WM command that arrives with write data B at cycle N+2 writes data B at the memory location 11 of the target memory at cycle N+2. The memory address is incremented by 1, and the updated memory address 12 is stored into the memory address register 90 at cycle N+3. The third MW command that arrives with write data C at cycle N+4 writes data C at the memory location 12 of the target memory at cycle N+4. The memory address is incremented by 1 at N+4, and the updated memory address 13 is stored into the memory address register 90 at cycle N+5. In this example timing chart, it is assumed that the execution of a SWM command takes one cycle and makes the memory address ready in the memory address register 90 at the next cycle. If it takes two or more cycles to execute a SWM command, a simple control logic is required to block the execution of the next command until the execution of the SWM command is complete. The same consideration holds for a WM command.

FIG. 11D is an example timing chart of the continuous-mode memory read operations in the protocol interface logic 40. The SRM command that arrives at cycle N stores the first read memory address 10 to the memory address register 90 at cycle N+1. The protocol interface logic 40 goes into the memory read mode at cycle N+1. The first RM command arrives at cycle N+1 and reads data A from the memory location 10 of the target memory and stores it into the DATA field of the outgoing packet register 84 at cycle N+1. The memory address is incremented by 1 at cycle N+1, and the updated memory address 11 is stored at cycle N+2. The data transfer at cycle N+3 sends the response packet with the memory data in the outgoing packet register 84 via the data buffer 21 to the host workstation 10. Similarly, the second RM command that arrives at cycle N+4 reads data B from the memory location 11 of the target memory and stores it into the DATA field of the outgoing packet register 84 at cycle N+5. The memory address is incremented by 1 at cycle N+4, and the updated memory address 12 is stored at cycle N+5. The data transfer at cycle N+6 sends the response packet with the memory data in the outgoing packet register 84 via the data buffer 21 to the host workstation 10. In this example timing chart, it is assumed that the execution of a SRM command takes one cycle and makes the memory address ready in the memory address register 90 at the next cycle. If it takes two or more cycles to execute a SRM command, a simple control logic is required to block the execution of the next command until the execution of the SRM command is complete. The same consideration holds for a RM command. Again, in this example timing chart, it is assumed for simplicity that the verification control program 11 knows when to initiate the data transfer to obtain each memory data after sending a RM command. If the verification control program 11 has no way to know when to inititate a data transfer to obtain a valid memory data in a response packet, the options discussed for a RR command are also available for a RM command.

Figure 12:
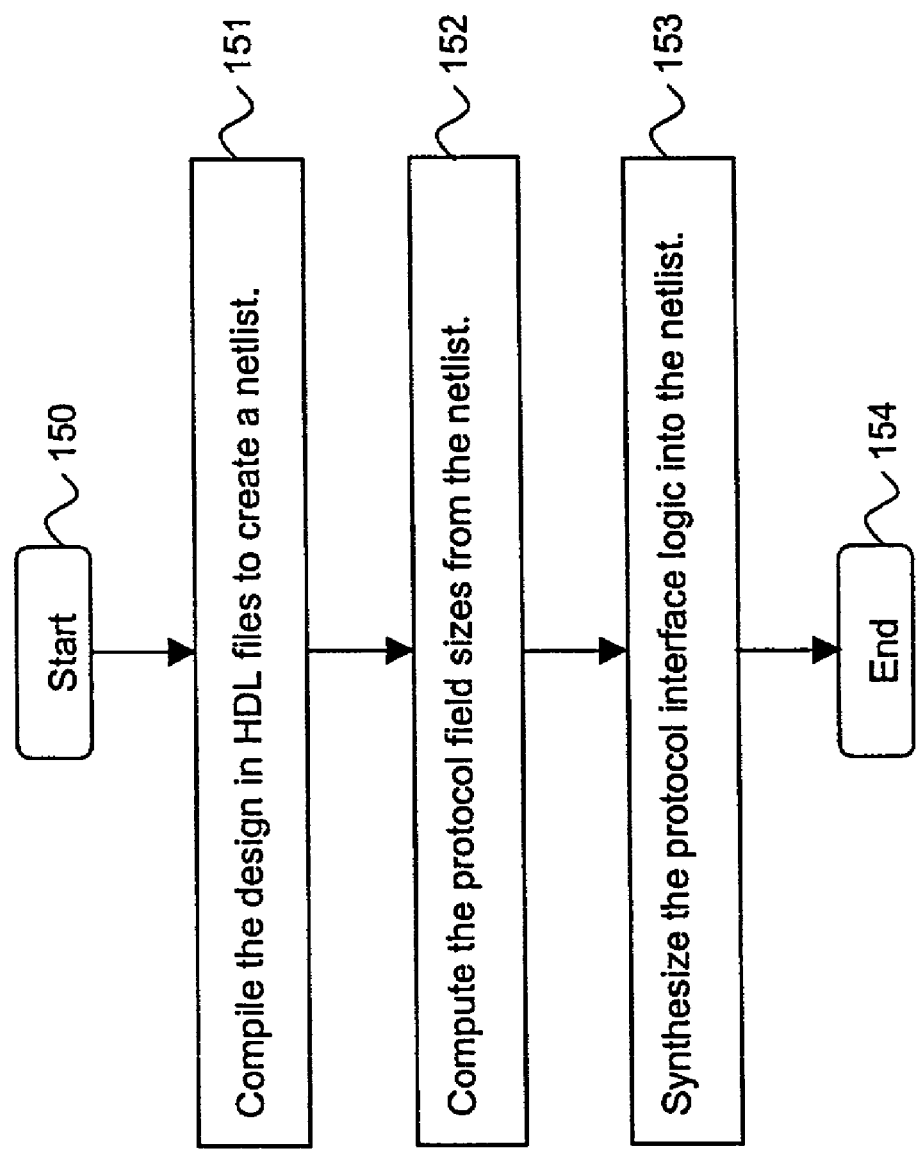
FIG. 12 is a flow chart of the compile-time steps to generate the protocol interface logic.

FIG. 12 is a flow chart showing compile-time steps used to generate protocol interface logic. The process starts at 150. The first step 151 compiles the target design written in one or more HDL or hardware description language files to create a netlist of the target design. The second step at 152 checks the size of the registers and memories in the netlist created 151 and computes the protocol field sizes based on the size of the registers and memories. The third step 153 synthesizes the protocol interface logic for the target design and adds it to the netlist. The process ends at 154.

FIG. 13 is a detailed flow chart of the step at 152 in FIG. 12 to compute the protocol field sizes from the netlist of the target design. The process starts at 160. Step 161 calls the countNumOfRegs function to find the number of registers, shown as variable "Nr", in the netlist and assigns a unique identifier to each register. Step 162 calls the countNumOfMems function to find the number of memories, shown as variable "Nm", in the netlist and assigns a unique identifier to each memory. Step 163 calls the "max" function to compare the values of Nr and Nm and assigns the larger value to a variable Ns. Step 164 calls the "ceil" function with the result returned by the "log2" function called with the value of Ns to compute the number of bits required to represent the maximum value of Ns and assigns it to a variable Nsl. Step 165 calls the "findWidestRegData" function to find the number of bits of the widest register data in the netlist and assigns it to a variable "Rd". Step 166 calls the "findWidestMemData" function to find the number of bits of the widest memory data in the netlist and assigns it to a variable "Md". Step 167 calls the "findWidestMemAddress" function to find the number of bits of the widest memory address in the netlist and assigns it to a variable "Ma". Step 168 calls the "max" function to compare the values of Rd, Md, and Ma and assigns the largest value to a variable Nd. Step 169 assigns 1 to a variable sizeTag for the TAG field size, 3 to a variable sizeCmd for the CMD field size, 1 to a variable sizeEnd for the END field size, the value of Nsl to the sizeId for the ID field size, and the value of Nd to a variable sizeData for the DATA field size. The process ends at 170.

When applied to the example DUV 30 illustrated in FIGS. 2A and 2B, the process computes Nr=3, Nm=2, Ns=3, Nsl=2, Rd=48, Md=40, Ma—14, and Nd=48, and s DATA field sizes to 2 and 48 bits, respectively, as illustrated in FIG. 3.

FIG. 14 is a detailed flow chart of the step 153 of FIG. 12, which constructs the components of a protocol interface logic. The process starts at 171. Step 172 calls the "createPacketIoBlock" function with the values of "Nsl" and "Nd" to create a packet I/O block 41, as illustrated in FIG. 3. The values of Nsl and Nd determine the size of the incoming and outgoing packet registers 80 and 84 and the number of the ID and DATA field signals 50 and 57. Step 173 calls the "createCommandDecodeBlock" function to create a command decode block 43, as illustrated in FIG. 7. This block 43 does not depend on the DUV. Step 174 calls the "createStateControlBlock" function to create a state control block 42, as illustrated in FIGS. 8 and 9. This block 42 does not depend on the DUV, either. Step 175 calls the "createMemoryAddressBlock" function with the value of Ma to create a memory address block 45, as illustrated in FIG. 4. The value of Ma determines the size of the memory address register 90. Step 176 calls the "createReadDataBlock" function with the value of Nd to create a read data block 46, as illustrated in FIG. 5. The value of Nd determines the maximum size of the read data 57 from the registers and memories. Step 177 calls the "createReadWriteControlBlock" function with the values of Nsl, Nr, and Nm to create a read/write control block 44, as illustrated in FIG. 10. The value of Nsl determines the number of the ID signals 50 and the size of the memory ID register 130. The values of Nr and Nm determine the number of register write enable signals and the number of memory write enable signals, respectively. Step 178 calls the "modifyRegBlock- InDuv" function to add data and control multiplexers (see e.g., multiplexers 61, 62, 63, 64, 65, 66, 67 in FIG. 2A) to the registers in the DUV if there is at least one register in the DUV. The multiplexers added to the DUV allow the protocol interface logic to have direct access to any of the registers in the DUV, as illustrated in FIG. 2A. Step 179 calls the "modifyMemBlockInDuv" function to add data and control multiplexers (see e.g., multiplexers 71, 72, 73, 75, 76, 77 in FIG. 2B) to the memories in the DUV if there is at least one memory in the DUV. The added multiplexers allow the protocol interface logic to have direct access to any of the memories in the DUV, as illustrated in FIG. 2B. The process ends at 180.

Figure 15:
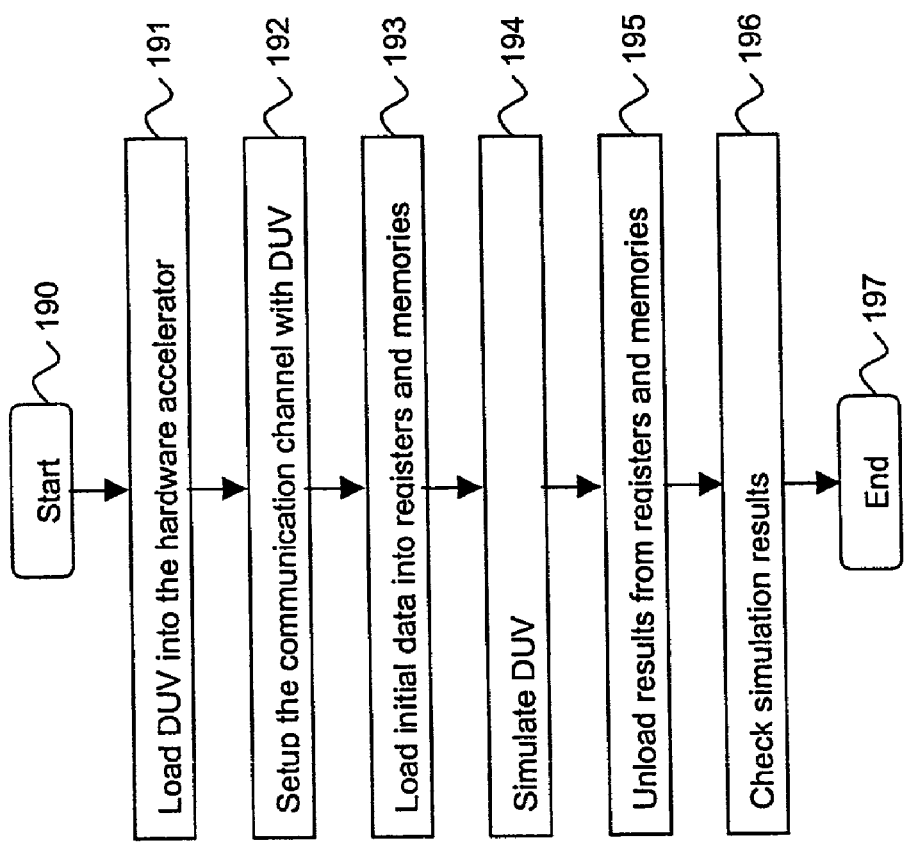
FIG. 15 is a flow chart of the run-time operations for simulation of the DUV with the protocol interface logic.

FIG. 15 is a flow chart of a typical run-time sequence of operations for simulation of a DUV and the protocol interface logic synthesized for the DUV. The process starts at 190. The compiled DUV is loaded into the hardware accelerator 20 at step 191. The communication channel 14 with the DUV is setup at step 192. The initial data are loaded into the registers and memories in the DUV at step 193. The DUV is simulated for a number of cycles at step 194. The simulation results are unloaded from the registers and memories at step 195. The simulation results are checked against the expected values at step 196. The process ends at 197. The protocol interface logic 40 disclosed herein is used to access the registers and memories in the DUV at steps 193 and 195. There may be some cases where some of the registers and memories in the DUV are accessed during simulation at step 194.

FIGS. 16–18 show code listings written in the C programming language with some local variable declarations omitted. The C programming language is a well-known programming language widely used for developing software. It is described, for example, in "The C Programming Language (2nd edition)" written by B. W. Kernighan and D. M. Ritchie, published 1988 by Prentice Hall. In the following explanations of the code listings, blank lines used only for better readability are not mentioned.

FIG. 16 is a code listing of the definitions and declarations of major constants, variables, and functions used to describe the operations with a protocol interface logic. Lines 1–7 define seven constants CMD_NOP, CMD_WR, CMD_RR, CMD_SWM, CMD_WM, CMD_SRM, and CMD_RM for seven protocol commands NOP (No Operation), WR (Write Register), RR (Read Register), SWM (Select Write Memory), WM (Write Memory), SRM (Select Read Memory), and RM (Read Memory), respectively. Line 10 defines "uint" as "unsigned int." Lines 11 and 12 declare "int" variables "sizeId" and "sizeData" to hold the sizes of the ID and DATA fields, respectively, of the response packet. Lines 14 and 15 declare "uint" variables "tagOut" and "tagIn" with initial value zero to hold the TAG values for outgoing and incoming packets, respectively. Lines 17 and 18 declare "uint" pointer variables "packetOut" and "packetIn" to hold the pointers to the request and response packets, respectively.

Lines 20–25 declare six external utility functions. Line 20 declares the put_bits function returning no value with four arguments to put the data bits into the target packet: void put_bits(uint *packet, int pos, int size, uint data), where "packet" is the pointer to the target packet, "pos" is the first bit position of data in the target packet, "size" is the number of data bits to copy, and "data" holds the data bits to copy. Line 21 declares the get_bits function returning no value with four arguments to get the data bits from the target packet: void get_bits(uint *packet, int pos, int size, uint *data), where "packet" is the pointer to the target packet, "pos" is the first bit position of the data bits in the target packet, "size" is the number of data bits to copy, and "data" holds the data bits from the target packet. Line 22 declares the copy_to_dbuff function returning no value with two arguments to copy one packet to the data buffer in the host workstation: void copy_to_dbuff(int size, uint *packet), where "size" is the total number of bits in the packet to copy and "packet" is the pointer to the place holding the packet bits. Line 23 declares the copy_from_dbuff function returning no value with two arguments to copy one packet from the data buffer in the host workstation: void copy_from_dbuff(int size, uint *packet), where "size" is the total number of bits in the packet to copy and "packet" is the pointer to the place to hold the copied packet data. Line 24 declares the transfer_to_haccel function returning no value with one argument to transfer a packet in the data buffer in the host workstation to the hardware accelerator: void transfer_to_haccel(int size), where "size" is the total number of bits in the packet to transfer. Line 25 declares the transfer_from_haccel function returning no value with one argument to transfer one packet from the hardware accelerator to the data buffer in the host workstation: void transfer_from_haccel(int size), where "size" is the total number of bits in the packet to transfer.

It is assumed for simplicity that the maximum number of data bits is equal to or less than 32. If it is greater than 32, The fourth argument data of the put_bits function should be a pointer to an uint array holding the data bits. Similarly, the fourth argument data of the get_bits function should be a pointer to an uint array to hold the data bits. In the following code fragments, it is also assumed for simplicity that the maximum number of data bits is equal to or less than 32. If it is larger than 32, some change have to be made to the codes, but it is not a difficult task for those skilled in the art.

FIG. 17 is a code listing of two functions for sending a request packet to and receiving a response packet from the protocol interface logic. Lines 30–41 define the sendPacket function returning no value with five arguments to send a request packet to the hardware accelerator: void sendPacket (uint cmd, uint end, uint id, int ds, uint data), where "cmd" is the CMD field value, which is one of the seven command constants defined at lines 1–7 in FIG. 16, "end" is the END field bit to indicate whether the packet is the last memory access command, "id" is the ID field value to indicate the target register/memory ID, "ds" is the number of data bits to send, "data" holds the data bits to send. Line 32 computes the total number of bits of the request packet by adding 5 (the total number of bits for the TAG, CMD, and END fields), the value of "sizeId," and the value of "ds" and assigns it to a variable "ps." Line 33 inverts the one-bit value of "tagOut" and stores it back to "tagOut" for the request packet. Line 34 calls put_bits(packetOut, 0, 1, tagOut) to copy the value of "tagOut" into the TAG field of the request packet pointed by "packetOut." Line 35 calls put_bits(packetOut, 1, 3, cmd) to copy the value of "cmd" into the CMD field of the request packet pointed by "packetOut." Line 36 calls put_bits(packetOut, 4, 1, end) to copy the value of "end" into the END field of the request packet pointed by "packetOut." Line 37 calls put_bits(packetOut, 5, sizeId, id) to copy the value of "id" into the ID field of the request packet pointed by "packetOut." Line 38 calls put_bits(packetOut, 5+sizeId, ds, data) to copy the data bits in "data" into the DATA field of the request packet pointed by "packetOut." Line 39 calls copy_to_dbuff(ps, packetOut) to copy the request packet pointed by "packetOut" to the data buffer in the host workstation. Line 40 calls transfer_to_haccel(ps)

to transfer the request packet from the data buffer in the host workstation to the hardware accelerator.

Lines 43–54 define the receivePacket function returning no value with two arguments to receive a response packet with data from the hardware accelerator: void receivePacket (int ds, uint *data), where "ds" is the total number of bits in a response packet and "data" is the pointer to the place to hold the data bits of the response packet. Line 45 computes the total number of bits of the response packet by adding 5, the value of "sizeId," and the value of "ds" and assigns it to a variable "ps." Lines 46–51 code a "while" loop to read a valid response packet from the hardware accelerator. Line 47 calls transfer_from_haccel(ps) to transfer one packet from the hardware accelerator to the data buffer in the host workstation. Line 48 calls copy_from dbuff(ps, packetIn) to copy one packet from the data buffer to the place pointed by "packetIn." Line 49 calls get_bits(packetIn, 0, 1, &tag) to extract the value of the TAG field of the packet and store it in a varibale "tag." Line 50 compares the value of "tag" against the value of "tagIn," which stores the previous "tag" value, and goes out of the "while" loop if the values are different, implying that the received packet is new and valid; otherwise, the operations at lines 47–50 are repeated. Line 52 stores the new "tag" value into "tagIn." Line 53 calls get_bits(packetIn, 5+sizeId, ds, data) to extract the data bits in the DATA field of the response packet and store them into the place pointed by the "data" variable.

FIG. 18 is a code listing of four functions: writeReg, readReg, writeMem, and readMem. Lines 60–63 define the writeReg function returning no value with three arguments: void writeReg(uint rid, int ds, uint data), where "rid" is the target register ID, "ds" is the number of data bits to write, and "data" holds the data bits to write. The writeReg function calls sendPacket(CMD_WR, 0, rid, ds, data) to send a RW command packet with the data bits to write at line 62. Lines 65–69 define the readReg function returning no value with three arguments: void readReg(uint rid, int ds, uint data), where "rid" is the target register ID, "ds" is the number of bits to read, and "data" holds the data bits read from the target register. The readReg function calls sendPacket(CMD_RR o, rid, 0, NULL) to send a RR command packet with no data at line 67 and receivePacket(ds, data) to read the data bits from the target register at line 68.

Lines 71-80 define the writeMem function returning no value with six arguments: void writeMem(uint mid, int as, uint start, int nw, int ds, uint *data), where "mid" is the target memory ID, "as" is the number of memory address bits, "start" is the starting memory address, "nw" is the number of memory words to write, "ds" is the number of bits per memory word, and "data" is the pointer to the array to hold the memory words to write. The writeMem function calls sendPacket(CMD_SWM, 0, mid, as, start) to send a SWM command with the target memory ID and starting memory address at line 74. After setting the initial value zero to a variable "end" at line 75, the writeMem function goes into a "for" loop at lines 76–79 to repeat the operations at lines 77–78 for the number of memory words to write. Line 77 sets the value one to the variable "end" if the i-th iteration is the last. Line 78 calls sendPacket(CMD_WM, 0, end, ds, data[i]) to send a WM command with the memory word from the i-th element of the data array.

Lines 82–92 define the readMem function returning no value with six arguments: void readMem(uint mid, int as, uint start, int nw, int ds, uint *data), where "mid" is the target memory ID, "as" is the number of address bits, "start" is the starting memory address, "nw" is the number of memory words to read, "ds" is the number of bits per memory word, and "data" is the pointer to the array to hold the memory words read from the target memory. The readMem function calls sendPacket(CMD_SRM, 0, mid, as, start) to send a SRM command with the target memory ID and starting memory address at line 85. After setting the initial value zero to a variable "end" at line 86, the readMem function goes into a "for" loop at lines 87–91 to repeat the operations at lines 88–90 for the number of memory words to read. Line 88 sets the value one to the variable "end" if the i-th iteration is the last. Line 89 calls sendPacket(CMD_RM, 0, end, ds, data[i]) to send a RM command to read the i-th memory word from the target memory. Line 90 calls receivePacket (ds, &data[i]) to receive the i-th memory word and store it into the i-th element of the data array.

In summary, what has been provided is a hardware-assisted verification system with vastly improved access to the memories and registers of a user's design undergoing functional verification. Certain embodiments use a packet-based protocol to perform data transfers between the host workstation and the hardware accelerator for loading data to and unloading data from the registers and memories in the target DUV. The protocol is associated with a protocol interface logic synthesized at compile time with the size parameters of the registers and memories in the target DUV and simulated with the target DUV at run time. The synthesized protocol interface logic decodes the request command encoded in a request packet from the verification control program running on the host workstation and executes it. If the request command is a read command, it sends the data in a response packet to the host workstation.

While an exemplary embodiment of the present invention has been disclosed in detail for an example DUV with three registers and two memories as illustrated in FIGS. 2A and 2B, it will be appreciated by those skilled in the art that modifications and alternatives can be practiced within the spirit of the invention. Thus, while preferred methods and apparatus have been described, as would be apparent to those skilled in the art, many more embodiments and applications are possible without departing from the inventive concepts disclosed herein. The invention, therefore is not to be restricted except in the spirit of the appended claims.

What is claimed is:

1. A hardware-assisted design verification system for verifying a target logic circuit design, said verification system having a host workstation in communication with a hardware accelerator, the target logic circuit design comprising Boolean logic gates, registers and memories, the host workstation loading data to or unloading data from the registers and memories, comprising:

protocol logic synthesized into the target logic circuit design, said protocol logic comprising:

an incoming packet register in communication with said host workstation, said incoming packet register storing packets that include data and commands communicated from the host workstation;

an outgoing packet register in communication with said host workstation, said outgoing packet register storing packets that include data to be communicated to the host workstation;

command decode logic, said command decode logic decoding said commands in said incoming packet register to identify a particular operation, register or memory location in said target logic circuit design, where said particular operation can comprise a write command and where said particular operation can also comprise a read command;

write command execution logic to write data stored in said incoming packet register into said register or memory location in said target logic circuit design for a write command decoded at said command decode logic;

read command execution logic to read data from said register or memory location in said target logic circuit design and store said data in said outgoing packet register for a read command decoded at said command decode logic; and interface logic interfacing said registers and memories in said target logic circuit design.

2. The hardware-assisted design verification system of claim 1, wherein said protocol logic includes logic to determine whether data from said incoming packet register is new and control activation of command decoding and execution.

3. A method of synthesizing a packet-based protocol logic for providing access to registers and memories in a target logic circuit design when performing functional verification using a hardware accelerator, comprising:

determining fixed sizes of a request packet, said request packet comprising tag, command, and data end fields;

counting how many of the registers are present in the target logic circuit design;

counting how many of the memories are present in the target logic circuit design;

determining a maximum identification field size of said request packet;

determining a maximum number of data bits of the registers in the target logic circuit design;

determining a maximum number of data bits of the memories in the target logic circuit design;

determining a maximum number of address bits of the memories in the target logic circuit design;

determining a maximum number of bits to send the register data, memory data, and memory address to the target logic circuit design to determine data field size of said request packet creating an incoming packet register coupled to an input data buffer in the hardware accelerator;

creating an outgoing packet register coupled to an output data buffer in the hardware accelerator;

creating a command decode block to decode a command in said incoming packet register;

creating an execution logic to execute a command decoded at said decode block; and creating interface logic to access the registers and memories in said target logic circuit design;

creating a memory identification register to identify the memories in the target logic circuit design;

creating a memory address register to provide a current memory address for access;

incrementing said current memory after a memory read command or a memory write command is executed;

creating a finite state machine to indicate that the packet-based protocol logic is in either non-memory mode, continuous memory write mode, or continuous memory read mode; and creating a state transition control that selects said non-memory mode when said continuous memory operation ends, said state transition control further selecting said continuous memory write mode when said continuous memory write operation is initiated, said state transition control further selecting said continuous memory read mode when said continuous memory read operation is initiated.

* * * * *